(12) United States Patent
Fan et al.

(10) Patent No.: US 11,991,458 B2
(45) Date of Patent: May 21, 2024

(54) COLUMN ARITHMETIC LOGIC UNIT DESIGN FOR DUAL CONVERSION GAIN SENSOR SUPPORTING CORRELATED MULTIPLE SAMPLING AND THREE READOUT PHASE DETECTION AUTOFOCUS

(71) Applicant: OMNIVISION TECHNOLOGIES, INC., Santa Clara, CA (US)

(72) Inventors: Lihang Fan, Sunnyvale, CA (US); Nijun Jiang, Shanghai (CN); Rui Wang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 124 days.

(21) Appl. No.: 17/934,196

(22) Filed: Sep. 21, 2022

(65) Prior Publication Data
US 2024/0098376 A1    Mar. 21, 2024

(51) Int. Cl.
| | |
|---|---|
| *H04N 25/75* | (2023.01) |
| *H03M 1/12* | (2006.01) |
| *H03M 1/18* | (2006.01) |
| *H04N 23/76* | (2023.01) |
| *H04N 25/78* | (2023.01) |

(52) U.S. Cl.
CPC .............. *H04N 23/76* (2023.01); *H03M 1/12* (2013.01); *H03M 1/18* (2013.01); *H03M 1/183* (2013.01); *H04N 25/75* (2023.01); *H04N 25/78* (2023.01)

(58) Field of Classification Search
CPC ...... H04N 25/75; H04N 23/76; H04N 25/772; H04N 25/78; H03M 1/12; H03M 1/18; H03M 1/183
See application file for complete search history.

(56) References Cited

U.S. PATENT DOCUMENTS

| | | | |
|---|---|---|---|
| 11,431,936 B2 | 8/2022 | Fan et al. | |
| 2015/0138408 A1* | 5/2015 | Lee | H04N 25/75 348/294 |
| 2020/0153440 A1* | 5/2020 | Sakurai | H03M 1/56 |
| 2021/0329185 A1* | 10/2021 | Fan | H03M 1/56 |
| 2022/0210359 A1* | 6/2022 | Shikina | H04N 25/75 |
| 2022/0269482 A1* | 8/2022 | Fan | G06F 7/507 |

\* cited by examiner

*Primary Examiner* — Lin Ye
*Assistant Examiner* — Chriss S Yoder, III
(74) *Attorney, Agent, or Firm* — Perkins Coie LLP

(57) ABSTRACT

An arithmetic logic unit (ALU) includes a front end latch stage coupled to a signal latch stage coupled to a Gray code (GC) to binary stage. First inputs of an adder stage are coupled to receive outputs of the GC to binary stage. Outputs of the adder stage are generated in response to the first inputs and second inputs of the adder stage. A pre-latch stage is coupled to latch outputs of the adder stage. A feedback latch stage is coupled to latch outputs of the pre-latch stage. The second inputs of the adder stage are coupled to receive outputs of the feedback latch stage. The feedback stage includes first conversion gain feedback latches configured to latch outputs of the pre-latch stage having a first conversion gain and second conversion gain feedback latches configured to latch outputs of the pre-latch stage having a second conversion gain.

29 Claims, 8 Drawing Sheets

COLUMN ARITHMETIC LOGIC UNIT DESIGN FOR DUAL CONVERSION GAIN SENSOR SUPPORTING CORRELATED MULTIPLE SAMPLING AND THREE READOUT PHASE DETECTION AUTOFOCUS

BACKGROUND INFORMATION

Field of the Disclosure

This disclosure relates generally to image sensors, and in particular but not exclusively, relates to an arithmetic logic unit for use in image sensors.

Background

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
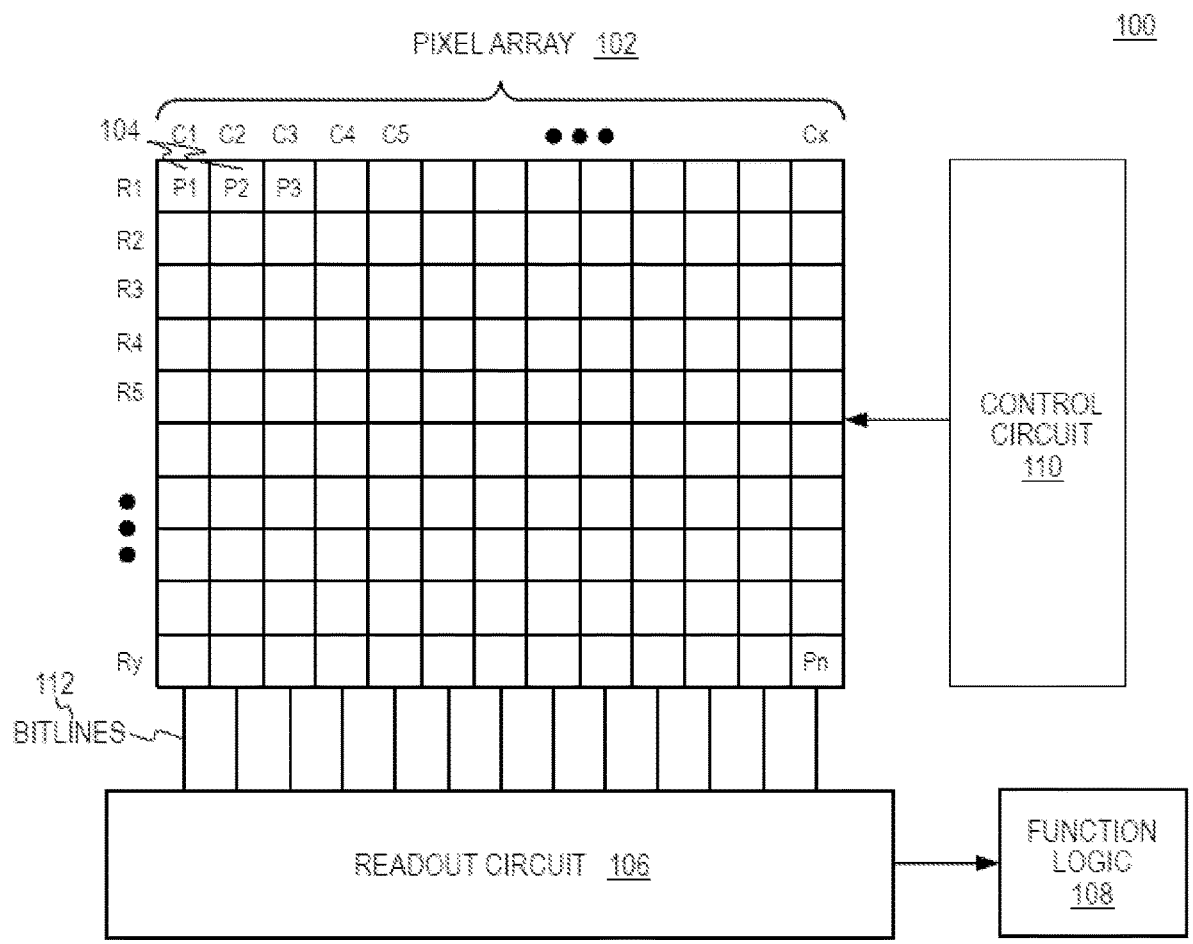
FIG. 1 illustrates one example of an imaging system including an image sensor with a pixel array with image sensing and phase detection autofocus pixels as well as a readout circuit including column arithmetic logic units in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to arithmetic logic units (ALUs) included in an analog to digital converter of an imaging system are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (e.g., rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an image sensor readout circuit are disclosed in which analog signals are read out in parallel from a pixel array with column arithmetic logic units (ALUs) through the column bit lines of an image sensor. In the various examples, image sensing and phase detection autofocus signals may be read out from the image sensor with correlated multiple sampling (CMS) outputs as well as with dual conversion gain to generate normalized outputs. In the various examples, each column bit line of the pixel array is coupled to one of the inputs of a respective comparator. The other input of each comparator is coupled to receive a global ramp signal. The output of each comparator is coupled to a respective column ALU that is coupled to output digital or binary representations of the analog image signals from the pixel array. In the various examples, normalized outputs (e.g., CMS outputs) generated by the column ALUs may be based on a difference between one or more image or phase detection autofocus (PDAF) samples and one or more black level samples from the pixel array. For instance, in one example, a normalized output may be generated by finding a difference between a signal sample and a black level sample. In another example, a normalized output may be generated by finding a difference between an accumulated sum of signal samples and an accumulated sum of black level samples. In yet another example, a normalized output may be generated by finding a difference between a signal sample and an average of multiple black level samples. In the various examples, a shared Gray code (GC) generator is used to generate GC outputs that are coupled to be received by each of the column ALUs to perform parallel analog to digital conversion (ADC) of the signals that are read out from the column bit lines in accordance with teachings of the present invention.

To illustrate, FIG. 1 illustrates one example of an imaging system 100 including a pixel array 102 from which analog image signals and PDAF signals are read out in parallel through column bit lines 112 to a readout circuit 106 in accordance with an embodiment of the present disclosure. As will be discussed in greater detail below, in various examples, readout circuit 106 includes circuitry to perform analog to digital conversion (ADC) of the image and PDAF data from pixel array 102 with parallel arithmetic logic units (ALUs) and a shared Gray code (GC) generator for dual conversion gain (DCG) and correlated multiple sampling (CMS) processing in accordance with the teachings of the present invention.

In particular, the example depicted in FIG. 1 shows an imaging system 100 that includes pixel array 102, control circuit 110, readout circuit 106, and function logic 108. In one example, pixel array 102 is a two-dimensional (2D) array including a plurality of pixel circuits 104, which include photodiodes (e.g., P1, P2, . . . , Pn). In various examples, the photodiodes P1, P2, . . . , Pn include photodiodes that are configured to provide image data as well as photodiodes that are configured to provided PDAF data. In various examples, the photodiodes that are configured to provide PDAF data may be interspersed among the photodiodes that are configured to provide image data. As illustrated in the depicted example, the pixel circuits 104 are arranged into rows (e.g., R1 to Ry) and columns (e.g., C1 to Cx) to acquire image data and/or PDAF data of a person, place, object, etc., which can then be used to render an image of a person, place, object, etc.

In the example, each pixel circuit 104 is configured to photogenerate image charge in response to incident light. After each pixel circuit 104 has acquired its image and/or PDAF charge, the corresponding analog image and/or PDAF charge data is read out by readout circuit 106 through column bit lines 112. In the various examples, the image and/or PDAF charge data from each row of pixel circuits 104 is read out in parallel through column bit lines 112 by readout circuit 106. In the various examples, the analog image and/or PDAF charge signals are converted to digital values, which are then transferred to function logic 108 in accordance with teachings of the present invention.

In various examples, the analog to digital conversion is performed with parallel ALUs and shared Gray code generator included in readout circuit 106. In various examples, the parallel ALUs readout included in readout circuit 106 may be configured to perform correlated double sampling (CDS) or correlated multiple sampling (CMS) processing by finding the difference between one or more signal level samples and one or more black level samples from each of a plurality of pixel circuits 104 of the pixel array 102. The function logic 108 may store the image data or even manipulate the image data by applying post image effects (e.g., crop, rotate, remove red eye, adjust brightness, adjust contrast, or otherwise).

Figure 2:
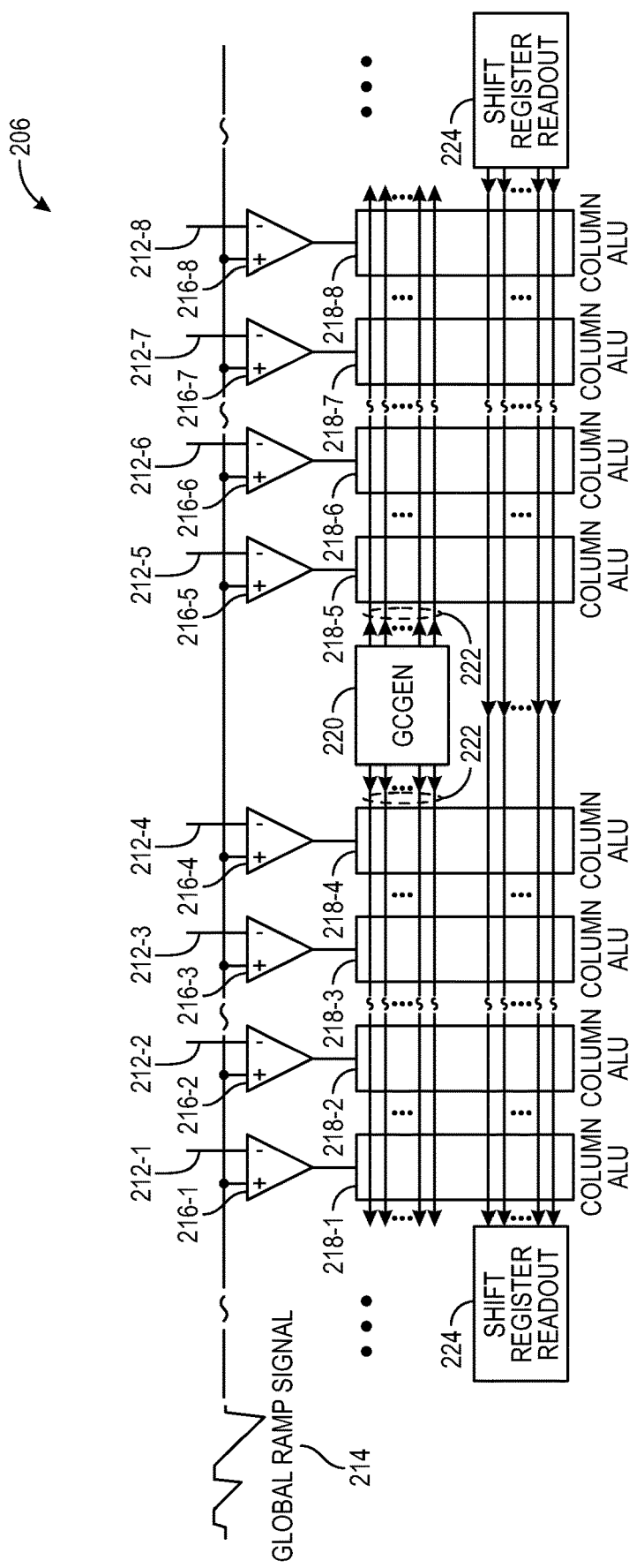
FIG. 2 illustrates a one example of a portion of a readout circuit including column analog to digital conversion with a Gray code generator and parallel column arithmetic logic units in accordance with the teachings of the present invention.

FIG. 2 illustrates a one example of a portion of a readout circuit 206 including column analog to digital conversion with a Gray code generator and parallel column arithmetic logic units (ALUs) in accordance with the teachings of the present invention. It is appreciated the readout circuit 206 of FIG. 2 may be one example of the readout circuit 106 of the image sensor 100 as shown in FIG. 1, and that similarly named and numbered elements described above are coupled and function similarly below.

As shown in the example depicted in FIG. 2, the portion of readout circuit 206 includes a plurality of comparators 216. Each one of the plurality of comparators 216 is coupled to receive a ramp signal 214, which in one example is a global ramp signal. Each one of the plurality of comparators 216 is further coupled to a respective one of a plurality of column bit lines 212 from an image sensor to receive a respective analog image or PDAF data signal from a column of the image sensor. As shown in the example, the outputs of the plurality of comparators 216 are coupled in parallel to respective column ALUs 218. Each one of the plurality of ALUs 218 is also coupled to receive Gray code (GC) outputs 222 that are generated by a shared Gray code (GC) generator 220 as shown. In one example, the GC outputs 222 that are generated by the GC generator 220 are phase-aligned 13-bit Gray code signals.

In operation, each one of the plurality of comparators 216 is coupled to generate a respective comparator output in response to a comparison of the respective analog image or PDAF data signal received from the respective bit line 212 and the ramp signal 214. In one example, when the voltage of the ramp signal 214 ramps down to a value equal to or less than the voltage of the analog image or PDAF data signal carried by the respective column bit line 212, a falling edge occurs at the output of the respective comparator 216. In the example, each respective column ALU 218 is coupled to sample and hold, or latch, the 13-bit Gray code signal 222 received from the GC generator 220 when the falling edge occurs at the output of the respective comparator 216 that is coupled to the respective column ALU 218. In the various examples, each column ALU 218 is then configured to perform Gray code to binary code conversion on the latched GC code signal 222.

In various examples, the column ALUs 218 may also be coupled perform correlated double sampling (CDS) or correlated multiple sampling (CMS) operations in parallel by determining a difference between one or more sampled and held reset (SHR) values (which may also be referred to as black level samples in this disclosure) and one or more sampled and held signal (SHS) samplings (which may also be referred to as signal level samples in this disclosure) from the respective column bit lines 212 to generate normalized digital image signal or PDAF data from the image sensor in accordance with the teachings of the present invention. In one example, the digital image or PDAF signal data generated from the column ALUs 218 may then be output to respective global read bit lines of the readout circuit 206.

In one example, the portion of readout circuit 206 shown in FIG. 2 may be one of a plurality of portions of readout circuit 206 that are repeated or "stitched together" across the columns of an image sensor array. In the example shown in FIG. 2, the image signal outputs from the column ALUs 218 may therefore be relayed from "right" to "left" through the column ALUs 218 of each portion of readout circuit 206, and with shift register readouts 224 coupled to the first and last columns and interspersed between every N columns of the image sensor array, to readout out the image or PDAF data from the image sensor array. For instance, in an example of a 48 megapixel sensor array, there are 8,000 columns. In the example, a single GC generator 220 may be shared among each N=500 columns of the sensor array, such that a total of 16× portions of readout circuit 206 shown in FIG. 2 are included between shift register readouts 224 coupled to the first and last columns and interspersed every 500 columns to readout the image signal outputs from the sensor array. In other words, shift readout registers 224 are coupled to respective ALUs 218 that are coupled to the first and last columns of the image sensor. In addition, shift registers 224 are coupled to and are interspersed between the plurality of ALUs 218 of each one of the plurality of readout circuits 206 to readout the respective digital image data signals from the plurality of ALUs 218.

Figure 3A:
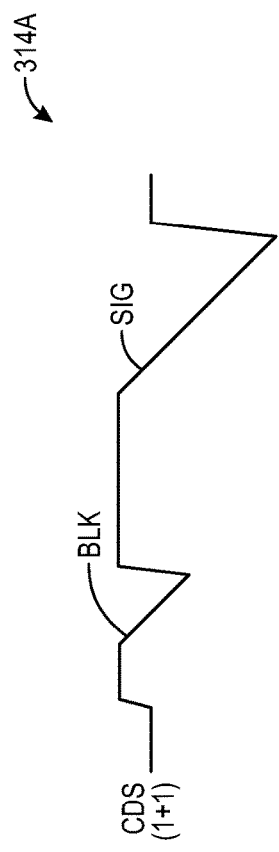
FIGS. 3A-3C illustrate various examples of the timing of global ramp signals provided during analog to digital conversions of one or more black level samples and one or more signal level samples during correlated double sampling or correlated multiple sampling operations from a dual conversion gain image sensor with image sensing and phase detection autofocus pixels in accordance with the teachings of the present invention.
Figure 3B:
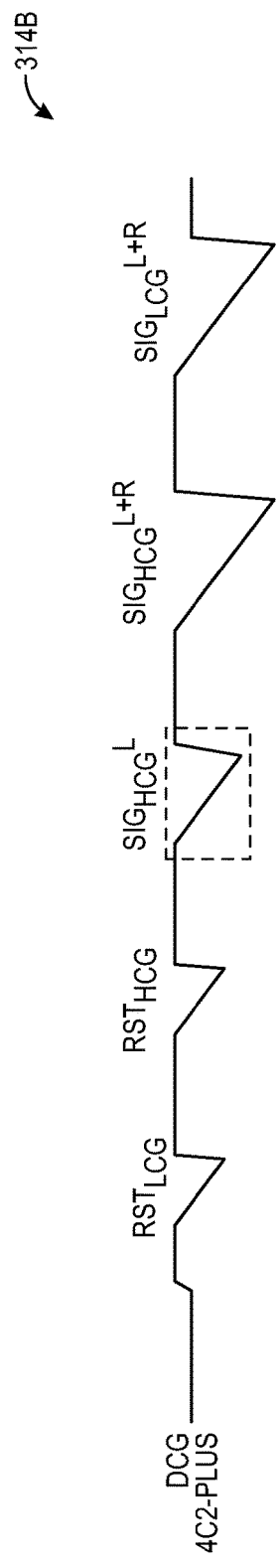
Figure 3C:
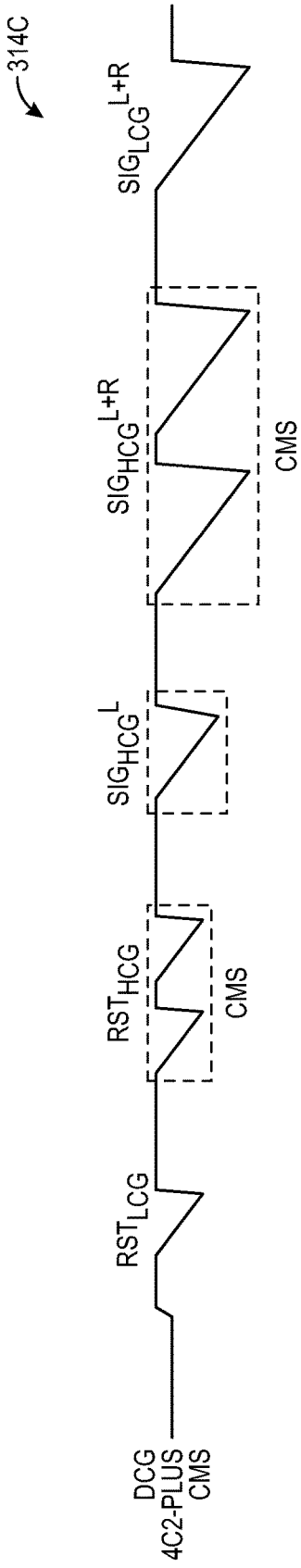

FIGS. 3A-3C illustrate various examples of global ramp signals provided during analog to digital conversions of one or more black level samples and one or more signal level samples during correlated double sampling (CDS) or correlated multiple sampling (CMS) operations of an imaging system in accordance with the teachings of the present invention.

For instance, FIG. 3A illustrates the timing of an example ramp signal 314A that is provided during the analog to digital conversion of one black level sample (e.g., "BLK") and one signal level sample (e.g., "SIG"). Thus, 2 (i.e., 1+1) samples are taken, and FIG. 3A therefore illustrates an example of ramp signal 314A of a correlated double sampling (CDS) operation, during which the difference between the one signal level sample SIG and the one black level sample BLK is determined (SIG−BLK) to generate the normalized output value for the image or PDAF data received from the image sensor.

FIG. 3B illustrates the timing of an example ramp signal 314B that is provided during the analog to digital conversion of multiple dual conversion gain (DCG) samples being taken of image data as well as PDAF data from a pixel array to provided normalized output signals. In the depicted example, it is noted that the pixels included in the pixel array may be organized into a binned 4C color filter pattern (e.g., 2×2) from which DCG image sensing as well as PDAF signals may be readout. As such, it is appreciated that the DCG image and PDAF signals from the 4C pixel array may be read out with DCG 4C2-plus processing. For instance, FIG. 3B illustrates the timing of the example ramp signal 314B that is provided during an analog to digital conversion of a low conversion gain (LCG) black level sample (e.g., "$RST_{LCG}$"), and then an analog to digital conversion of a high conversion gain (HCG) black level sample (e.g., "$RST_{HCG}$"), and then an analog to digital conversion of an HCG PDAF signal level sample (e.g., "$SIG_{HCG}^{L}$"), and then an analog to digital conversion of an HCG image signal level sample (e.g., "$SIG_{HCG}^{L+R}$"), and then an analog to digital conversion of an LCG image signal level sample (e.g., "$SIG_{LCG}^{L+R}$").

In the example readout operation depicted in FIG. 3B, a normalized LCG image signal can be provided by finding the difference between the LCG image signal level sample (e.g., "$SIG_{LCG}^{L+R}$") and the LCG black level sample (e.g., "$RST_{LCG}$"), or "$SIG_{LCG}^{L+R} - RST_{LCG}$." Similarly, a normalized HCG image signal can be provided by finding the difference between HCG image signal level sample (e.g., "$SIG_{HCG}^{L+R}$") and the HCG black level sample (e.g., "$RST_{HCG}$"), or "$SIG_{HCG}^{L+R} - RST_{HCG}$." A normalized HCG PDAF signal can be provided by finding the difference between HCG PDAF signal level sample (e.g., "$SIG_{HCG}^{L}$") and the HCG black level sample (e.g., "$RST_{HCG}$"), or "$SIG_{HCG}^{L} - RST_{HCG}$."

FIG. 3C illustrates the timing of another example ramp signal 314C that is provided during the analog to digital conversion of multiple dual conversion gain (DCG) samples being taken of image data as well as PDAF data from a pixel array to provide normalized DCG 4C2-plus output signals with correlated multi sampling (CMS). As shown, the example ramp signal 314C is provided during an analog to digital conversion of a low conversion gain (LCG) black level sample (e.g., "$RST_{LCG}$"), and then an analog to digital conversion of first and second high conversion gain (HCG) black level samples (e.g., "$RST_{HCG}$"), and then an analog to digital conversion of an HCG PDAF signal level sample (e.g., "$SIG_{HCG}^{L}$"), and then an analog to digital conversion of first and second HCG image signal level samples (e.g., "$SIG_{HCG}^{L+R}$"), and then an analog to digital conversion of an LCG image signal level sample (e.g., "$SIG_{LCG}^{L+R}$"). In the example, the multiple first and second HCG black level samples (e.g., "$RST_{HCG}$") and the multiple first and second HCG image signal level sample (e.g., "$SIG_{HCG}^{L+R}$") are taken to provide correlated multiple sampling (CMS) processing. It is appreciated that the first and second HCG black level samples may also be referred to as "$RST1_{HCG}$" and "$RST2_{HCG}$" in various examples, and that the first and second HCG image signal level samples may also be referred to as "$SIG1_{HCG}^{L+R}$" and "$SIG2_{HCG}^{L+R}$" in various examples.

In the example readout operation depicted in FIG. 3C, a normalized (e.g., CDS) LCG image signal can be provided by finding the difference between the LCG image signal level sample (e.g., "$SIG_{LCG}^{L+R}$") and the LCG black level sample (e.g., "$RST_{LCG}$"), or "$SIG_{LCG}^{L+R} - RST_{LCG}$." In one example, a normalized HCG image signal with CMS can be provided by finding the difference between a sum of the first and second HCG image signal level samples (e.g., "SIG1$_{HCG}^{L+R}$+SIG2$_{HCG}^{L+R}$") and the sum of the first and second HCG black level samples (e.g., "RST1$_{HCG}$+RST2$_{HCG}$"), or ("SIG1$_{HCG}^{L+R}$+SIG2$_{HCG}^{L+R}$")−("RST1$_{HCG}$+RST2$_{HCG}$"). In one example, a normalized HCG PDAF signal with CMS can be provided by finding the difference between an HCG PDAF signal level sample (e.g., "SIG$_{HCG}^{L}$") and the average of the first and second HCG black level samples (e.g., "(RST1$_{HCG}$+RST2$_{HCG}$)/2"), or "SIG$_{HCG}^{L}$−(RST1$_{HCG}$+RST2$_{HCG}$)/2)".

In the above described example in FIG. 3C, it is noted that CMS is applied with the two samples taken for the first and second HCG black level samples "RST1$_{HCG}$" and "RST2$_{HCG}$," and the two samples taken for the first and second HCG image signal level samples "SIG1$_{HCG}^{L+R}$" and "SIG2$_{HCG}^{L+R}$," while CDS is applied with the one sample taken for the LCG black level sample "RST$_{LCG}$" and the one sample taken for the LCG image level sample "SIG$_{LCG}^{L+R}$" because LCG processing is utilized for high light or bright light conditions, where circuit noise is not dominant and CDS processing is therefore sufficient. In particular, in the high light conditions, pixel shot noise is dominant, which is not reduced with CMS processing. In addition, it is further appreciated that the one HCG PDAF signal level sample "SIG$_{HCG}^{L}$" is for autofocus processing, for which noise does not matter as much compared to image signal data.

Figure 4A:
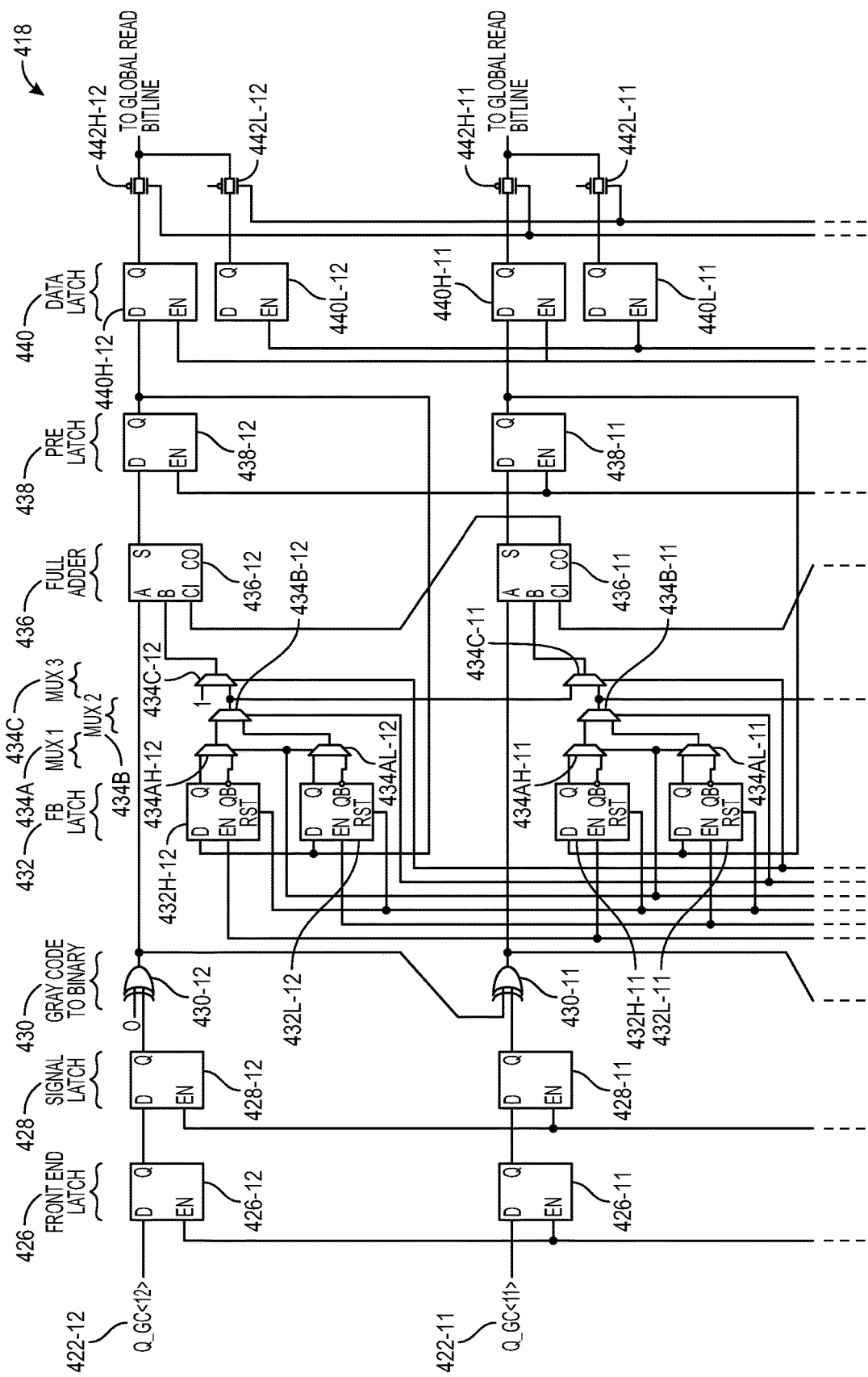
FIGS. 4A-4B are a schematic that illustrates one example of one of a plurality of arithmetic logic units in accordance with the teachings of the present invention.
Figure 4B:
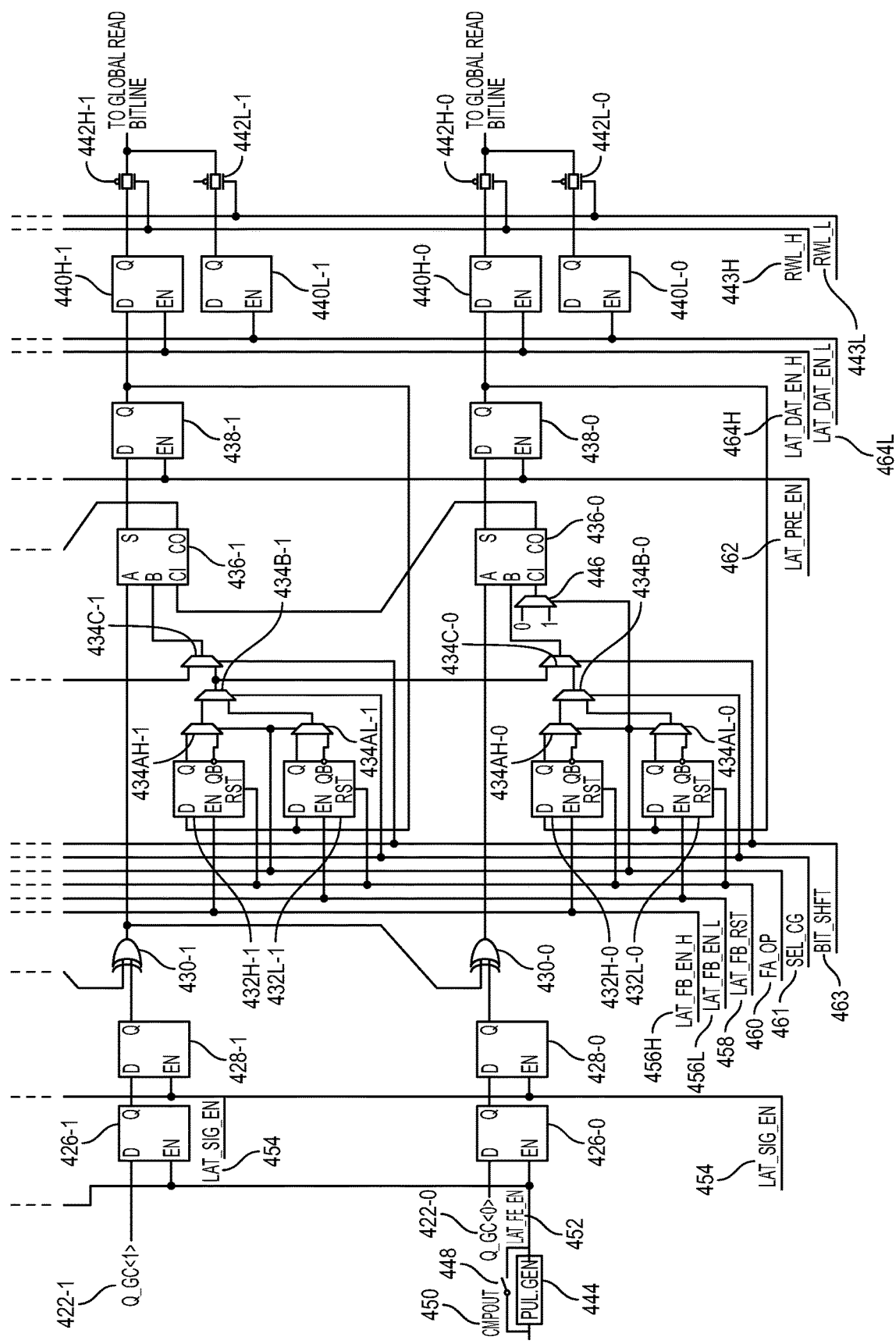

FIGS. 4A-4B are a schematic that illustrates one example of one of a plurality of arithmetic logic units (ALUs) 418 in accordance with the teachings of the present invention. It is appreciated the ALU 418 of FIGS. 4A-4B may be one example of one of the plurality of column ALUs 218 as shown in FIG. 2, and that similarly named and numbered elements described above are coupled and function similarly below.

As will be shown below in the various examples, it is noted that each one of the plurality of ALUs 418 is coupled to sample and hold or latch the received 13-bit Gray code Q_GC<12:0>422 in response to a comparator output 450. In one example, each ALU 418 is coupled to latch the 13-bit Gray code Q_GC<12:0>422, which are labeled individually in FIGS. 4A-4B as Q_GC<0>422-0 to Q_GC<12>422-12, in response to the arrival of a falling edge of comparator output 450 to complete the analog to digital conversion by converting the latched 13-bit Gray code Q_GC<12:0>422 to a binary value.

In various examples, the plurality of ALUs 418 are further coupled to perform correlated double sampling (CDS) or correlated multiple sampling (CMS) in parallel by determining a difference between one or more signal level samples and one or more black level samples of the image or PDAF data that are read out from each of a plurality of pixel circuits 104 of the pixel array 102 to generate a normalized digital or binary output value for the data received from the image sensor. As will be discussed, in one example, a normalized LCG image signal output may be generated by finding a difference between an LCG signal sample and an LCG black level sample. In another example, a normalized HCG signal output may be generated by finding a difference between an accumulated sum of HCG signal samples and an accumulated sum of HCG black level samples. In yet another example, a normalized PDAF output may be generated by finding a difference between an HCG PDAF signal sample and an average of multiple HCG black level samples.

To illustrate, the example ALU 418 shown in FIGS. 4A-4B includes a front end latch stage 426 coupled to receive and latch respective Gray code Q_GC<0>422-0 to Q_GC<12>422-12 signal values in response to comparator output OUTOUT 450. In the illustrated example, front end latch stage 426 includes a plurality of latches 426-0 to 426-12, each of which has a data input "D" coupled to receive a respective bit of Gray code Q_GC<0>422-0 to Q_GC<12>422-12.

In the example, ALU 418 also includes a pulse generator 444 that is coupled to receive the comparator output 450 from the respective comparator (e.g., comparator 216) of the column. In one example, the pulse generator 444 is coupled to generate a front end latch enable signal LAT_FE_EN 452 in response to the arrival of a falling edge in the comparator output CMPOUT 450. In one example, the pulse of front end latch enable signal LAT_FE_EN 452 is coupled to an enable input of each one of the plurality of latches 426-0 to 426-12 of front end latch stage 426.

In one example, ALU 418 also includes a bypass switch 448 coupled between the input and the output of pulse generator 444 of FIGS. 4A-4B to implement a bypass mode. One reason for the bypass mode is because in various examples, the pulse generator 444 may be sensitive to noise in the VDD supply and/or noise in ground, which may cause unwanted image artifacts. Thus, in excessively noisy conditions, it may be desirable to bypass the pulse generator 444. In operation, when bypass switch 448 is closed, the bypass mode is enabled. When the bypass mode is enabled, the front end latch enable signal LAT_FE_EN 452 is substantially the same or substantially equal to the comparator output CMPOUT 450. When the bypass switch 448 is opened, the bypass mode is disabled. When the bypass mode is disabled, the front end latch enable signal LAT_FE_EN 452 is substantially the same or substantially equal to the output pulse from the pulse generator 444.

In the depicted example, ALU 418 also includes a signal latch stage 428 coupled to the output of the front end latch stage 426. In operation, the signal latch stage 428 is coupled to latch outputs of the front end latch stage 426 in response to a signal latch enable signal LAT_SIG_EN 454. In the depicted example, the signal latch stage 428 includes a plurality of latches 428-0 to 428-12. Each one of the plurality of latches 428-0 to 428-12 has a data input "D" coupled to the "Q" output of a respective one of a plurality of latches 426-0 to 426-12 of the front end latch stage 426. Each one of the plurality of latches 428-0 to 428-12 has an enable input "EN" coupled to receive the signal latch enable signal LAT_SIG_EN 454.

The example in FIGS. 4A-4B shows that ALU 418 also includes a GC to binary stage 430 that is coupled to generate binary representations of the Gray code Q_GC<0>422-0 to Q_GC<12>422-12 signal values latched in the front end latch stage 426. In the illustrated example, GC to binary stage 430 includes a plurality of exclusive-OR (XOR) gates 430-0 to 430-12, each of which has an output coupled to generate the corresponding binary bit, and a first input coupled to receive a respective "Q" output of the plurality of latches 428-0 to 428-12 of signal latch stage 428. Assuming that the Gray code Q_GC<12:0>422 signal values have N bits, where Gray code Q_GC<12>422-12 is the most significant bit (MSB) and Gray code Q_GC<11:0>are the N−1 least significant bits (LSBs), each one of the plurality of XOR gates 430-0 to 430-11 that corresponds to one of the N−1 LSBs has a second input coupled to receive respective outputs of nearest neighboring XOR gates of GC to binary stage 430 corresponding to a higher bit value as shown. In the example depicted in FIGS. 4A-4B, the second input of the XOR gate 430-12, which corresponds to the MSB, is coupled to receive a logic low level (e.g., "0").

As shown in the depicted example depicted in FIGS. 4A-4B, the ALU 418 also includes an adder stage 436, which includes a plurality of full adders 436-0 to 436-12, each of which having a first input "A" coupled to an output of the GC to binary stage 430, and a second input "B" coupled to an output of a third multiplexer stage MUX3434C, which will be described in greater detail below. In operation, outputs "S" of the adder stage are generated in response to the first inputs "A" and the second inputs "B" of the adder stage 436, which in the example is the sum of the values received at the first inputs "A" and the values received at second inputs "B."

The example in FIGS. 4A-4B shows that ALU 418 also includes a pre-latch stage 438 coupled to latch outputs of the adder stage 436 in response to a pre-latch enable signal LAT_PRE_EN 462. In the depicted example, the pre-latch stage 438 includes a plurality of latches 438-0 to 438-12. Each one of the plurality of latches 438-0 to 438-12 has a data input "D" coupled to the "S" output of a respective one of the plurality of full adders 436-0 to 436-12 of the adder stage 436. Each one of the plurality of latches 438-0 to 438-12 has an enable input "EN" coupled to receive the pre-latch enable signal LAT_PRE_EN 462.

The example in FIGS. 4A-4B shows that ALU 418 also includes a feedback latch stage 432 coupled to latch outputs of the pre-latch stage 438 in response to first and second feedback latch enable signals LAT_FB_EN_H 456H and LAT_FB_EN_L 456L. As shown in the depicted example, the feedback latch stage 432 includes a plurality of first conversion gain feedback latches, which are labeled 432H-0 to 432H-12, and a plurality of second conversion gain feedback latches, which are labeled 432L-0 to 432L-12. In the example, the first conversion gain feedback latches 432H-0 to 432H-12 may be configured to latch outputs of the pre-latch stage 438 having for example a high conversion gain (HCG) in response to the first feedback latch enable signal LAT_FB_EN_H 456H, and the second conversion gain feedback latches 432L-0 to 432L-12 may be configured to latch outputs of the pre-latch stage 438 having for example a low conversion gain (LCG) in response to a second feedback latch enable signal LAT_FB_EN_L 456L.

As shown in the depicted example, each one of the first conversion gain feedback latches 432H-0 to 432H-12 and second conversion gain feedback latches 432L-0 to 432L-12 of the feedback latch stage 432 has a data input "D" coupled to the "Q" output of a respective one of the plurality of latches 438-0 to 438-12 of the pre-latch stage 438. Each one of the first conversion gain feedback latches 432H-0 to 432H-12 has an enable input "EN" coupled to receive the first feedback latch enable signal LAT_FB_EN_H 456H and a reset input coupled to receive a feedback latch reset signal LAT_FB_RST 458. Similarly, each one of the second conversion gain feedback latches 432L-0 to 432L-12 has an enable input "EN" coupled to receive the second feedback latch enable signal LAT_FB_EN_L 456L and a reset input coupled to receive the feedback latch reset signal LAT_FB_RST 458.

In the various examples, the first conversion gain feedback latches 432H-0 to 432H-12 and second conversion gain feedback latches 432L-0 to 432L-12 of the feedback latch stage 432 can be reset (e.g., zeroed) in response to the feedback latch reset signal LAT_FB_RST 458. As shown in the example, the outputs of the first conversion gain feedback latches 432H-0 to 432H-12 and second conversion gain feedback latches 432L-0 to 432L-12 of the feedback latch stage 432 include first outputs "Q" and second outputs "Qb." In the examples, the second outputs "Qb" are complements or inverted representations of the first outputs "Q."

As shown in the depicted example, a first multiplexer stage MUX1 434A includes a plurality of first multiplexers 434AH-0 to 434AH-12 coupled to the first outputs "Q" and the second outputs "Qb" of first conversion gain feedback latches 432H-0 to 432H-12 of the feedback latch stage 432. The first multiplexer stage MUX1 434A also includes a plurality of second multiplexers 434AL-0 to 434ALH-12 coupled to the first outputs "Q" and the second outputs "Qb" of second conversion gain feedback latches 432L-0 to 432L-12 of the feedback latch stage 432. In operation, the first multiplexers 434AH-0 to 434AH-12 and the second multiplexers 434AL-0 to 434AL-12 of the first multiplexer stage MUX1 434A are configured to select between either first outputs "Q" or the second outputs "Qb" of the first conversion gain feedback latches 432H-0 to 432H-12 and second conversion gain feedback latches 432L-0 to 432L-12 of the feedback latch stage 432 in response to an adder operation signal FA_OP 460.

As shown in the depicted example, a second multiplexer stage MUX2 434B includes a plurality of multiplexers 434B-0 to 434B-12. Each of the multiplexers 434B-0 to 434B-12 includes a first input coupled to an output of a respective one of the first multiplexers 434AH-0 to 434AH-12, and a second input coupled to an output of a respective one of the second multiplexers 434AL-0 to 434AL-12. As a result, in operation, the multiplexers 434B-0 to 434B-12 of the second multiplexer stage MUX2 434B are configured to select between either the outputs of the first (e.g., HCG) multiplexers 434AH-0 to 434AH-12 of the first multiplexer stage 434A or the outputs of the second (e.g., LCG) multiplexers 434AL-0 to 434AL-12 of the first multiplexer stage 434A in response to a select conversion gain signal SEL_CG 461.

Referring back to the third multiplexer stage MUX3 434C mentioned previously, the third multiplexer stage MUX3 434C includes a plurality of multiplexers 434C-0 to 434C-12. As shown in the depicted example, the multiplexers 434C-0 to 434C-12 of the third multiplexer stage MUX3 434C have inputs that are coupled to the outputs of the multiplexers 434B-0 to 434B-12 of the second multiplexer stage MUX2 434B. In operation, each of the multiplexers 434C-0 to 434C-12 of the third multiplexer stage MUX3 434C is configured to either output the same bit output from the respective multiplexer 434B-0 to 434B-12 of the second multiplexer stage MUX2 434B or the higher bit from the higher respective multiplexer 434B-1 to 434B-12 of the second multiplexer stage MUX2 434B in response to a bit shift signal BIT_SHFT 463 as shown. In the case of the most significant bit (MSB), the multiplexer 434C-12 of the third multiplexer stage 434C is configured to either output the same bit output from the respective multiplexer 434B-12 of the second multiplexer stage MUX2 434B or a "1" (e.g., high value) in response to the bit shift signal BIT_SHFT 463 as shown. As mentioned previously, the outputs of the multiplexers 434C-0 to 434C-12 of the third multiplexer stage MUX3 434C are coupled to the respective second inputs "B" of the respective one of the full adders 436-0 to 436-12 as shown.

Therefore, in operation, it is appreciated that the feedback latch stage 432, the first multiplexer stage MUX1 434A, the second multiplexer stage MUX2 434B, and third multiplexer stage MUX3 434C are configured to feed back the "S" outputs of the adder stage 436, or a value responsive to the "S" output of the adder stage 436, back into the second input "B" of the adder stage 436 through the pre-latch stage 438 in response to the first feedback latch enable signal LAT_FB_EN_H 456H, the second feedback latch enable signal LAT_FB_EN_L 456L, the feedback latch reset signal LAT_FB_RST 458, the adder operation signal FA_OP 460, the select conversion gain signal SEL_CG 461, and the bit shift signal BIT_SHFT 463 as shown.

In so doing, the sums generated by the adder stage 436 can be accumulated in the pre-latch stage 438 and then transferred to the feedback latch stage 432 over one or more summing operations of adder stage 436 between resets of the feedback latch stage 432 in accordance with the teachings of the present invention. In the various examples, the pre-latch stage 438 and the feedback latch stage 432 may be configured to be controlled by different enable signals with different timing to avoid oscillations.

As shown in the depicted example, the LSB of the adder stage 436 is full adder 436-0. In the example, the carry-in "CI" input of full adder 436-0 is coupled to an output of a multiplexer 446. In operation, the multiplexer 446 is configured to select either a low value or a high value (e.g., "0" or "1") to be coupled to be received by the carry-in "CI" input of full adder 436-0 in response to the adder operation signal FA_OP 460.

Thus, in operation, the carry-in "CI" input of full adder 436-0 is coupled to receive a low value (e.g., "0") from the multiplexer 446 when the second inputs "B" of the adder stage 436 are coupled to receive the first outputs "Q" from either the first conversion gain feedback latches 432H-0 to 432H-12 or the second conversion gain feedback latches 432L-0 to 432L-12 of the feedback latch stage 432 through the first multiplexer stage MUX1 434A, the second multiplexer stage MUX2 434B, and the third multiplexer stage MUX3 434C. Similarly, the carry-in "CI" input of full adder 436-0 is coupled to receive a high value (e.g., "1") from multiplexer 446 when the second inputs "B" of the adder stage 436 are coupled to receive the second outputs "Qb" from either the first conversion gain feedback latches 432H-0 to 432H-12 or the second conversion gain feedback latches 432L-0 to 432L-12 of the feedback latch stage 432 through the first multiplexer stage MUX1 434A, the second multiplexer stage MUX2 434B, and the third multiplexer stage MUX3 434C.

Accordingly, it is appreciated that the adder stage 436 is configured to add a feedback value latched in either the first conversion gain feedback latches 432H-0 to 432H-12 or the second conversion gain feedback latches 432L-0 to 432L-12 of the feedback latch stage 432 and the binary representation of the GC outputs latched in the signal latch stage 428 through GC to binary stage 430 when the first multiplexer stage MUX1 434A, the second multiplexer stage MUX2 434B, and third multiplexer stage MUX3 434C are configured to couple the first outputs "Q" of either the first conversion gain feedback latches 432H-0 to 432H-12 or the second conversion gain feedback latches 432L-0 to 432L-12 of the feedback latch stage 432 to the second inputs "B" of the adder stage 436.

Similarly, the adder stage 436 is configured to add a two's complement representation of a feedback value latched in either the first conversion gain feedback latches 432H-0 to 432H-12 or the second conversion gain feedback latches 432L-0 to 432L-12 of the feedback latch stage 432 and the binary representation of the GC outputs latched in the signal latch stage 428 through the GC to binary stage 430 when the first multiplexer stage MUX1 434A, the second multiplexer stage MUX2 434B, and third multiplexer stage MUX3 434C are configured to couple the second outputs "Qb" of either the first conversion gain feedback latches 432H-0 to 432H-12 or the second conversion gain feedback latches 432L-0 to 432L-12 of the feedback latch stage 432 to the second inputs "B" of the adder stage 436. It is appreciated of course that the two's complement representation of the feedback value latched in the feedback latch stage 432 is the inverted binary representation (e.g., the inverted "Qb" output) plus one, which can be realized by setting the carry-in "CI" input of full adder 436-0 to receive a high value (e.g., "1") from multiplexer 446. As a result, the adder stage 436 can perform subtraction by adding a negative representation of a number (e.g., the two's complement representation) to another number.

Continuing with the illustrated example, ALU 418 also includes a data latch stage 440 coupled between the pre-latch stage 438 and an ALU output of the ALU 418. As shown in the depicted example, data latch stage 440 is coupled to latch outputs of the pre-latch stage 438. In the depicted example, the data latch stage 440 includes a plurality of first, or high, conversion gain data latches 440H-0 to 440H-12 configured to latch outputs of the pre-latch stage 438 having a first, or high, conversion gain, and a plurality of second, or low, conversion gain data latches 440L-0 to 440L-12 configured to latch outputs of the pre-latch stage 438 having a second, or low, conversion gain.

In operation, the first conversion gain data latches 440H-0 to 440H-12 of the data latch stage 440 are coupled to latch the outputs of the pre-latch stage 438 in response to a first data latch enable signal LAT_DAT_EN_H 464H and the second conversion gain data latches 440L-0 to 440L-12 of the data latch stage 440 are coupled to latch the outputs of the pre-latch stage 438 in response to a second data latch enable signal LAT_DAT_EN_L 464L. In the illustrated example, each of the first conversion gain data latches 440H-0 to 440H-12 and the second conversion gain data latches 440L-0 to 440L-12 of the data latch stage 440 has a data input "D" coupled to receive a respective output "Q" from pre-latch stage 438. In addition, each of the first conversion gain data latches 440H-0 to 440H-12 includes an enable input "EN" coupled to receive the first data latch enable signal LAT_DAT_EN_H 464H and each of the second conversion gain data latches 440L-0 to 440L-12 includes an enable input "EN" coupled to receive the second data latch enable signal LAT_DAT_EN_L 464L.

In the depicted example, a plurality of first transmission gates 442H-0 to 442H-12 responsive to a first transmission gate enable signal rwl_H 443H are coupled between the respective "Q" outputs of the first conversion gain data latches 440H-0 to 440H-12 and the ALU output. Similarly, a plurality of second transmission gates 442L-0 to 442L-12 responsive to a second transmission gate enable signal rwl_L 443L are coupled between the respective "Q" outputs of the second conversion gain data latches 440L-0 to 440L-12 and the ALU output.

In one example, the ALU output is coupled to a global read bitline. In one example, the ALU output is coupled to a global read bitline via a shift register readout, such as for example as illustrated and described in FIG. 2 above.

Figure 5A:
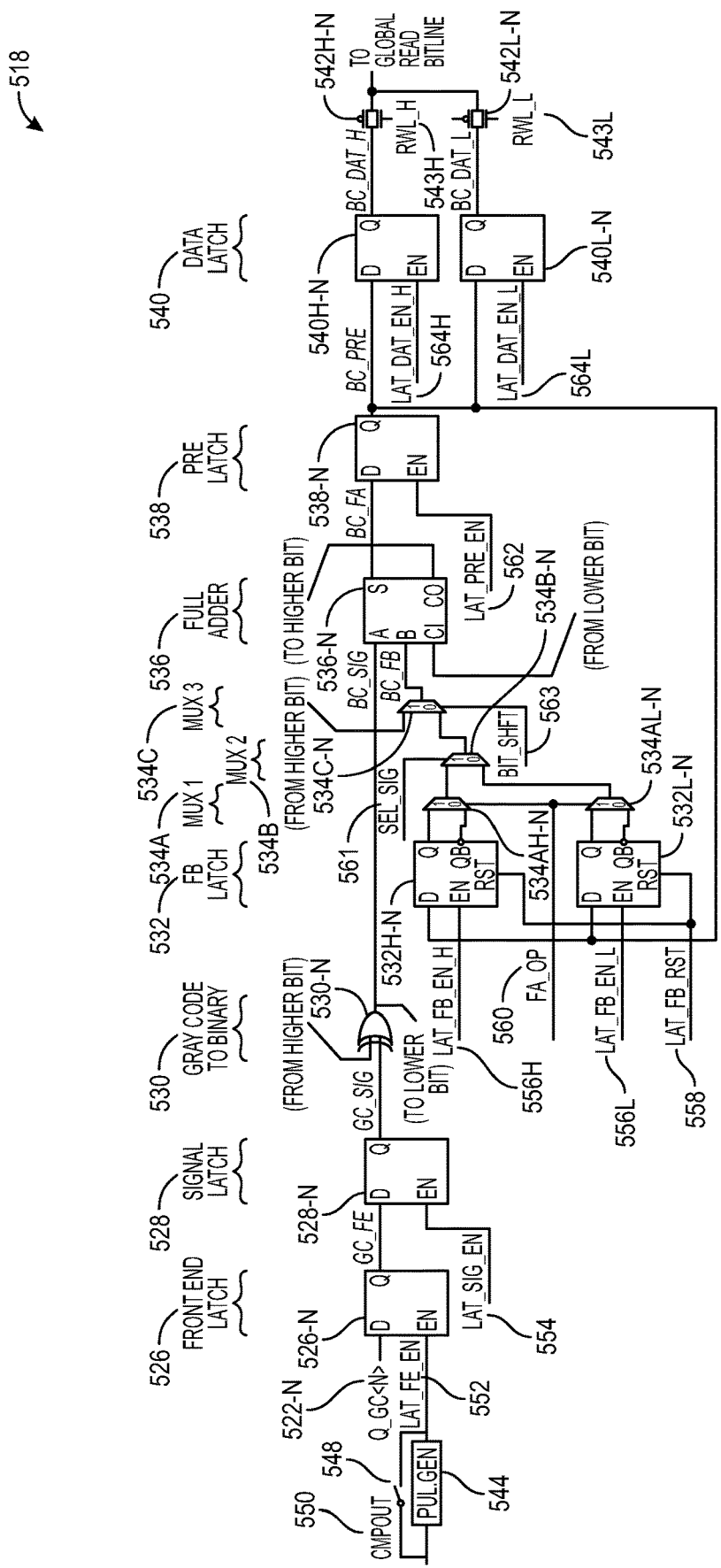
FIGS. 5A-5C illustrate an example schematic of one of the bits of an example arithmetic logic unit with corresponding examples of timing and signal flow during the generation of a normalized low conversion gain image signal, a normalized high conversion gain image signal, and a normalized high conversion gain phase detection autofocus signal as well as a simplified example of a readout of those signals from an example arithmetic logic unit in accordance with the teachings of the present invention.
Figure 5B:
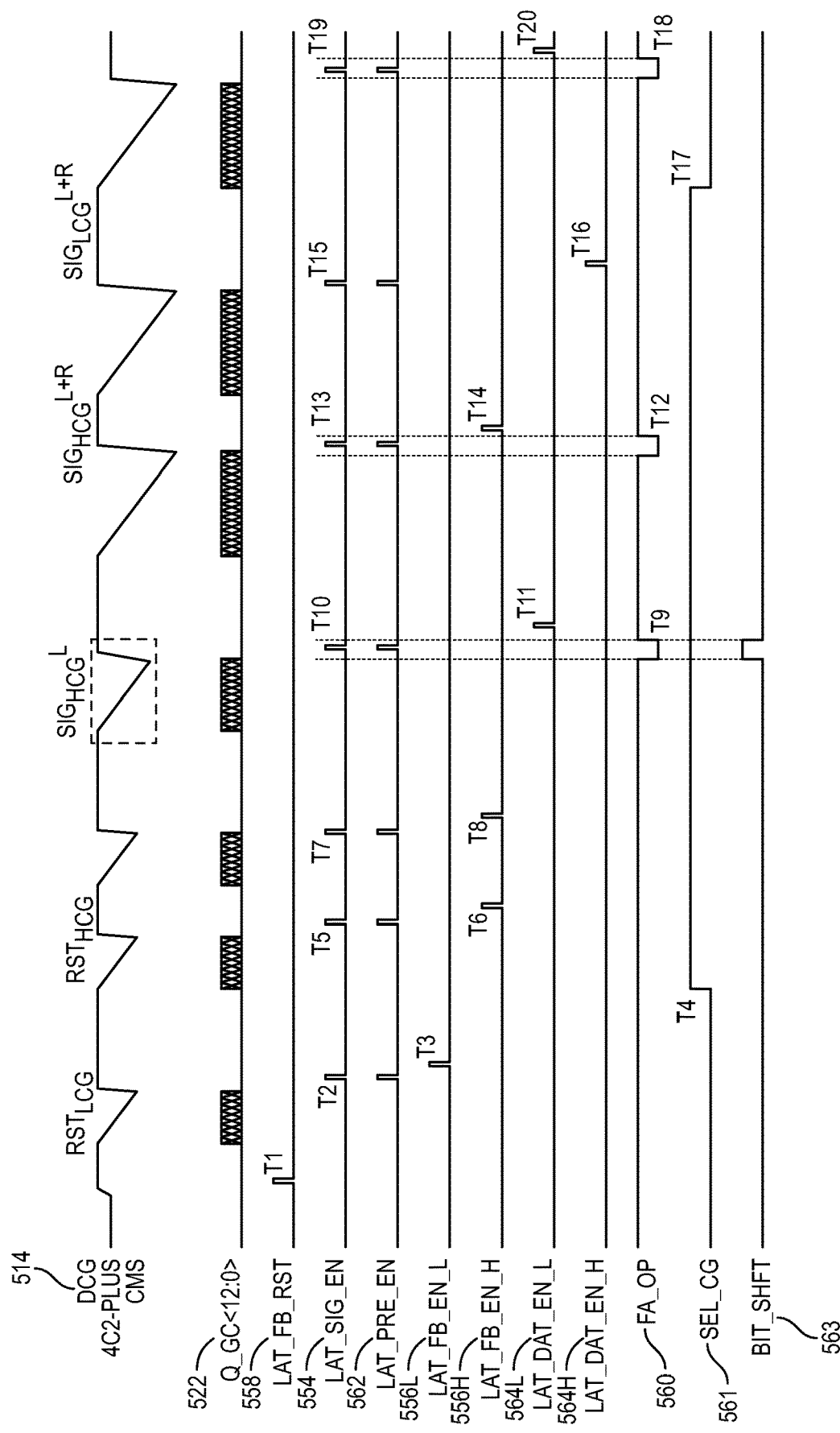
Figure 5C:
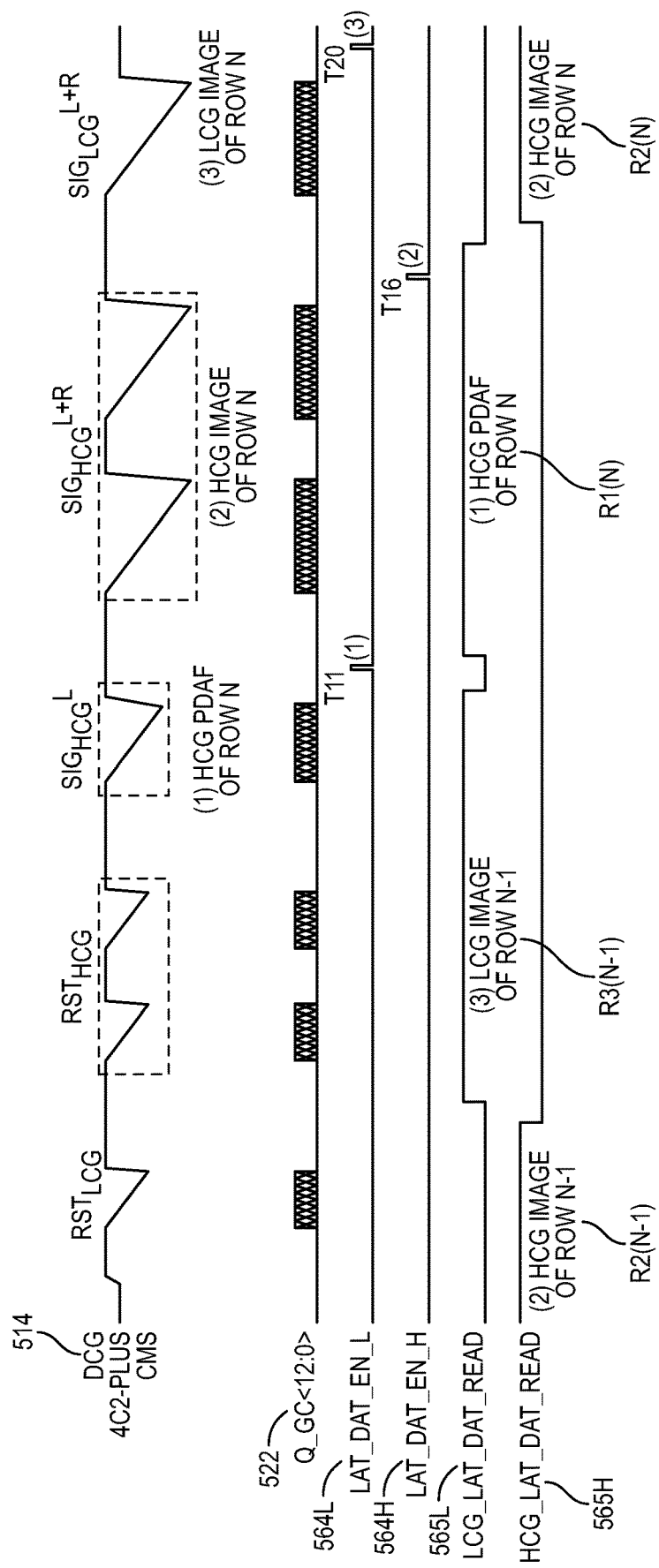

FIGS. 5A-5C illustrate an example schematic of one of the bits of an example arithmetic logic unit with corresponding examples of timing and signal flow during the generation of a normalized low conversion gain image signal, a normalized high conversion gain image signal, and a normalized high conversion gain phase detection autofocus signal as well as a simplified example of a readout of those signals from an example arithmetic logic unit in accordance with the teachings of the present invention. It is appreciated that FIG. 5A illustrates one bit of an ALU 518, which may be one example of one of the bits of ALU 418 as shown in FIGS.

4A-4B, and that similarly named and numbered elements described above are coupled and function similarly below.

For instance, as shown in FIG. 5A, ALU 518 includes a front end latch stage 526 including a front end latch 526-*n* coupled to receive and latch a Gray code bit Q_GC 522-*n* signal value in response to comparator output CMPOUT 550. ALU 518 also includes a pulse generator 544 that is coupled to receive the comparator output CMPOUT 550 from the respective comparator (e.g., comparator 216) of the column. In one example, the pulse generator 544 is coupled to generate a front end latch enable signal LAT_FE_EN 552 in response to the arrival of a falling edge in the comparator output CMPOUT 550. In one example, ALU 518 also includes a bypass switch 548 coupled between the input and output of pulse generator 544.

In the depicted example, ALU 518 also includes a signal latch stage 528 including a signal latch 528-*n* coupled to the output of the front end latch stage 526. In operation, the signal latch stage 528 is coupled to latch outputs of the front end latch stage 526 in response to a signal latch enable signal LAT_SIG_EN 554. ALU 518 also includes a GC to binary stage 530 including an XOR gate 530-*n* that is coupled to generate binary representations of the Gray code bit Q_GC 522 signal value latched in the front end latch stage 526.

In the example, the ALU 518 also includes an adder stage 536, which includes a full adder 536-*n* having a first input "A" coupled to an output of the GC to binary stage 530, a second input "B" coupled to an output of a multiplexer 534C-*n* of a third multiplexer stage 534 in response to a bit shift signal BIT_SHFT 563. In operation, output "S" of the adder stage is generated in response to the first input "A" and the second input "B" of the adder stage 536, which in the example is the sum of the value received at the first inputs "A" and the value received at second inputs "B."

In the depicted example, ALU 518 also includes a latch 538-*n* of a pre-latch stage 538 coupled to latch output "S" of the adder stage 536 in response to a pre-latch enable signal LAT_PRE_EN 562. The ALU 518 also includes a feedback latch stage 532, which includes a first conversion gain feedback latch 532H-*n* and a second conversion gain feedback latch 532L-*n*, coupled to latch the output of the pre-latch stage 538 in response to a first feedback latch enable signal LAT_FB_EN_H 556H and a second feedback latch enable signal LAT_FB_EN_L 556L, respectively. In the various examples, the first conversion gain feedback latch 532H-*n* and the second conversion gain feedback latch 532L-*n* of feedback latch stage 532 can be reset (e.g., zeroed) in response to the feedback latch reset signal LAT_FB_RST 558. As shown in the example, the outputs of the first conversion gain feedback latch 532H-*n* and the second conversion gain feedback latch 532L-*n* of feedback latch stage 532 include first outputs "Q" and second outputs "Qb." The first outputs "Q" of the first conversion gain feedback latch 532H-*n* and the second conversion gain feedback latch 532L-*n* of feedback latch stage 532 are the latched outputs of the pre-latch stage 538. The second outputs "Qb" of the first conversion gain feedback latch 532H-*n* and the second conversion gain feedback latch 532L-*n* of feedback latch stage 532 are inverted latched outputs of the pre-latch stage 538.

As shown in the depicted example, a first multiplexer stage MUX1 534A includes a first multiplexer 534A-*n* coupled to the first output "Q" and the second output "Qb" of first conversion gain feedback latch 532H-*n* of the feedback latch stage 432. The first multiplexer stage MUX1 534A also includes a second multiplexer 434AL-*n* coupled to the first outputs "Q" and the second output "Qb" of second conversion gain feedback latch 432L-*n* of the feedback latch stage 532. In operation, the first multiplexer 534AH-*n* and the second multiplexer 534AL-*n* of the first multiplexer stage MUX1 534A are configured to select between either first outputs "Q" or the second outputs "Qb" of the first conversion gain feedback latch 532H-*n* and second conversion gain feedback latches 532L-*n* of the feedback latch stage 532 in response to an adder operation signal FA_OP 560.

As shown in the depicted example, a second multiplexer stage MUX2 534B includes a multiplexer 534B-*n*. Multiplexer 534B-*n* the second multiplexer stage MUX2 534B includes a first input coupled to an output of first multiplexer 534AH-*n* of first multiplexer stage MUX1 534A, and a second input coupled to an output of second multiplexers 534AL-*n* of first multiplexer stage MUX1 534A. As a result, in operation, multiplexers 534B-*n* of the second multiplexer stage MUX2 534B is configured to select between either the output of the first (e.g., HCG) multiplexer 534AH-*n* or the output of the second (e.g., LCG) multiplexer 534AL-*n* of the first multiplexer stage MUX1 534A in response to a select conversion gain signal SEL_CG 561.

The third multiplexer stage MUX3 534C includes multiplexer 534C-*n*. As shown in the depicted example, the multiplexer 534C-*n* of the third multiplexer stage MUX3 534C has an input that is coupled to the output of the multiplexer 534B-*n* of the second multiplexer stage MUX2 534B. In operation, multiplexers 534C-*n* of the third multiplexer stage MUX3 534C is configured to either output the same bit output from the respective multiplexer 534B-*n* of the second multiplexer stage MUX2 534B or the higher bit from the higher respective multiplexer of the second multiplexer stage MUX2 534B in response to a bit shift signal BIT_SHFT 563 as shown. As mentioned previously, in the case of the most significant bit (MSB), the multiplexer 534C-*n* of the third multiplexer stage 534C is configured to either output the same bit output from the respective multiplexer 534B-*n* of the second multiplexer stage MUX2 534B or a "1" (e.g., high value) in response to the bit shift signal BIT_SHFT 563. The output of the multiplexer 534C-*n* of the third multiplexer stage MUX3 534C is coupled to the respective second input "B" of the respective full adder 536-*n* of adder stage 536 as shown.

Therefore, in operation, it is appreciated that the feedback latch stage 532, the first multiplexer stage MUX1 534A, the second multiplexer stage MUX2 534B, and third multiplexer stage MUX3 534C are configured to feed back the "S" output of the adder stage 536, or a value responsive to the "S" output of the adder stage 536, back into the second input "B" of the adder stage 536 through the pre-latch stage 538 in response to the first feedback latch enable signal LAT_FB_EN_H 556H, the second feedback latch enable signal LAT_FB_EN_L 556L, the feedback latch reset signal LAT_FB_RST 558, the adder operation signal FA_OP 560, the select conversion gain signal SEL_CG 561, and the bit shift signal BIT_SHFT 563 as shown.

As discussed above, it is appreciated that the adder stage 536 is configured to perform addition by adding a feedback value received from the feedback latch stage 532 through the first multiplexer stage MUX1 534A, the second multiplexer stage MUX2 534B, and third multiplexer stage MUX3 534C and the binary representation of the GC outputs latched in the signal latch stage 528 through GC to binary stage 530. Similarly, the adder stage 536 is configured to perform subtraction in response to the adder operation signal FA_OP 560 by adding the two's complement representation of a feedback value latched in the feedback latch stage 532 and the binary representation of the GC outputs latched in the signal latch stage 528 through the GC to binary stage 530 when the first multiplexer stage 534A is configured to couple the second outputs "Qb" of the feedback latch stage 532 to the second inputs "B" of the adder stage 536. In addition, high conversion gain (HCG) or low conversion gain (LCG) feedback values may be selected from the feedback latch stage 532 in response to the select conversion gain signal SEL_CG 561 received by the second multiplexer stage 534B. In one example, a fraction of the feedback value from the feedback latch stage 532 (e.g., divided by 2) may be provided from the feedback latch stage 532 in response to the bit shift signal BIT_SHFT 563 received by the third multiplexer stage MUX3 534C.

Continuing with the illustrated example, ALU 518 also includes a data latch stage 540 coupled between the pre-latch stage 538 and an ALU output of the ALU 518. As shown in the depicted example, data latch stage 540 is coupled to latch outputs of the pre-latch stage 538. In the depicted example, the data latch stage 540 includes a first conversion gain data latch 540H-n, which may be configured to latch the output of the pre-latch stage 538 having a first, or high, conversion gain, and a second conversion gain data latch 540L-n, which may be configured to latch output of the pre-latch stage 538 having a second, or low, conversion gain. In operation, the data latch stage 540 is coupled to latch the output of the pre-latch stage 538 in response to a first data latch enable signal LAT_DAT_EN_H 564H and/or a second data latch enable signal LAT_DAT_EN_L 564L. In addition, ALU 518 also includes a first transmission gate 542H-n responsive to a first transmission gate signal rwl_H 543H coupled between the respective "Q" output of the first data latch 540H-n of data latch stage 540 and the ALU output. Similarly, a second transmission gate 542L-n responsive to a second transmission gate signal rwl_L 543L coupled between the respective "Q" output of the second data latch 540L-n of data latch stage 540 and the ALU output. In one example, the ALU output is coupled to a global read bitline.

As shown in the example depicted in FIG. 5B, ramp signal 514 includes one LCG black level sample event $RST_{LCG}$, two HCG black level sample events $RST_{HCG}$, which may also be referred to as $RST1_{HCG}$ and $RST2_{HCG}$, one HCG PDAF sample event $SIG_{HCG}^{L}$, two HCG image signal sample events $SIG_{HCG}^{L+R}$, which may also be referred to as $SIG1_{HCG}^{L+R}$ and $SIG2_{HCG}^{L+R}$, and then one LCG image signal sample events\$SIG_{LCG}^{L+R}$. As will be discussed, the ramp signal 514 is an example ramp signal from which dual conversion gain (DCG) LCG and HCG image and PDAF signals from the 4C pixel array may be read out with DCG 4C2-plus CMS processing. It is further appreciated that the example ramp signal 514 illustrated in FIG. 5B is another example of the ramp signal 314C described above in FIG. 3C.

The example depicted in FIG. 5B illustrates an example of the timing and signal flow during the generation of a normalized LCG image signal, a normalized HCG image signal, and a normalized HCG PDAF signal example ALU 518 in accordance with the teachings of the present invention. In particular, the example depicted in FIG. 5B illustrates examples of Gray code signals Q_GC<12:0> 522, feedback latch reset signal LAT_FB_RST 558, latch enable signal LAT_SIG_EN 554, pre-latch enable signal LAT_PRE_EN 562, second feedback latch enable signal LAT_FB_EN_L 556L, first feedback latch enable signal LAT_FB_EN_H 556H, second data latch enable signal LAT_DAT_EN_L 564L, first data latch enable signal LAT_DAT_EN_H 564H, adder operation signal FA_OP 560, select conversion gain signal SEL_CG 561, and bit shift signal BIT_SHFT 563.

The example depicted in FIG. 5B shows that at time T1, the feedback latch reset signal LAT_FB_RST 558 is pulsed, which resets the first conversion gain feedback latch 532H-n and the second conversion gain feedback latch 532L-n of the feedback latch stage 532 and zeroes out any previous data latched in the feedback latch stage 532. Next the LCG black level sample event $RST_{LCG}$ occurs and the Gray code signals Q_GC<12:0> 522 count as the ramp signal 514 ramps down until CMPOUT 550 (not shown) stops the Gray code signals Q_GC<12:0> 522 from counting and causes the front end latch stage 526 to latch the LCG black level sample value $RST_{LCG}$ as represented in Gray code signal Q_GC<12:0> 522.

At time T2, the signal latch enable signal LAT_SIG_EN 554 and pre-latch enable signal LAT_PRE_EN 562 are pulsed, which causes the GC to binary stage 530 to convert the Gray code Q_GC<12:0> 522 representation of the $RST_{LCG}$ sample latched in signal latch stage 528 to binary, which is coupled to be received at the first input "A" of the adder stage 536.

At the same time, it is noted that the select conversion gain signal SEL_CG 561 is set to a low value of "0", which causes the second multiplexer stage MUX2 534B to select the second multiplexer 534AL-n coupled to the outputs of the second conversion gain (e.g., LCG) feedback latch 532L-n of the feedback latch stage 532. The reset or zero value latched in the second conversion gain feedback latch 532L-n of the feedback latch stage 532 is received at the second input "B" of the adder stage 536. The adder operation signal FA_OP 560 is set to a high value of "1" at this time, which causes the first multiplexer stage MUX1 to choose the first outputs "Q" of the feedback latch stage 532 to be selected and results in an addition operation (instead of a subtraction operation) to performed by the adder stage 536. In the depicted example, ALU 518 is configured to perform addition when the adder operation signal FA_OP 560 is set to 1, while ALU 518 is configured to perform subtraction (or add a 2's complement number to another number) when the adder operation signal FA_OP 560 is set to 0. As such, the adder stage 536 is configured to determine the sum of LCG black level sample event $RST_{LCG}$ and 0, which is latched into the pre-latch stage 538.

At time T3, the second feedback latch enable signal LAT_FB_EN_L 556L is pulsed, which causes the $RST_{LCG}$ value that is latched in the pre-latch stage 538 to be latched into the second conversion gain (e.g., LCG) feedback latch 532L-n of the feedback latch stage 532.

Next, at time T4, the select conversion gain signal SEL_CG 561 transitions to a high value of "1," which causes the second multiplexer stage MUX2 534B to select the first multiplexer 534AH-n, which is coupled to the outputs of the first conversion gain (e.g., HCG) feedback latch 532H-n of the feedback latch stage 532.

Next, the first HCG black level sample event $RST1_{HCG}$ occurs and the Gray code signals Q_GC<12:0> 522 count as the ramp signal 514 ramps down until CMPOUT 550 (not shown) stops the Gray code signals Q_GC<12:0> 522 from counting and causes the front end latch stage 526 to latch the first HCG black level sample value $RST1_{HCG}$ as represented in Gray code signal Q_GC<12:0> 522.

At time T5, the signal latch enable signal LAT_SIG_EN 554 and pre-latch enable signal LAT_PRE_EN 562 are pulsed, which causes the GC to binary stage 530 to convert the Gray code Q_GC<12:0> 522 representation of the first HCG black level sample $RST1_{HCG}$ latched in signal latch stage 528 to binary, which is coupled to be received at the first input "A" of the adder stage 536. At the same time, the reset or zero value latched in the first conversion gain (e.g., HCG) feedback latch 532H-n of the feedback latch stage 532 is received at the second input "B" of the adder stage 536. The adder operation signal FA_OP 560 is set to a high value of "1" at this time, which causes the first multiplexer stage MUX1 to choose the first outputs "Q" of the feedback latch stage 532 to be selected and results in an addition operation to performed by the adder stage 536. As such, the adder stage 536 is configured to determine the sum of the first HCG black level sample event $RST1_{HCG}$ and 0, which is latched into the pre-latch stage 538.

At time T6, the first feedback latch enable signal LAT_FB_EN_H 556H is pulsed, which causes the $RST1_{HCG}$ value that is latched in the pre-latch stage 538 to be latched into the first conversion gain (e.g., HCG) feedback latch 532H-n of the feedback latch stage 532.

Next, the second HCG black level sample event $RST2_{HCG}$ occurs and the Gray code signals Q_GC<12:0> 522 count as the ramp signal 514 ramps down until CMPOUT 550 (not shown) stops the Gray code signals Q_GC<12:0> 522 from counting and causes the front end latch stage 526 to latch the second HCG black level sample value $RST2_{HCG}$ as represented in Gray code signal Q_GC<12:0> 522.

At time T7, the signal latch enable signal LAT_SIG_EN 554 and pre-latch enable signal LAT_PRE_EN 562 are pulsed, which causes the GC to binary stage 530 to convert the Gray code Q_GC<12:0> 522 representation of the second HCG black level sample $RST2_{HCG}$ latched in signal latch stage 528 to binary, which is coupled to be received at the first input "A" of the adder stage 536. At the same time, the first HCG black level sample $RST1_{HCG}$ previously latched in the first conversion gain (e.g., HCG) feedback latch 532H-n of the feedback latch stage 532 (at time T6) is received at the second input "B" of the adder stage 536. The adder operation signal FA_OP 560 is set to a high value of "1" at this time, which causes the first multiplexer stage MUX1 to choose the first outputs "Q" of the feedback latch stage 532 to be selected and results in an addition operation to performed by the adder stage 536. As such, the adder stage 536 is configured to determine the sum of the second HCG black level sample $RST2_{HCG}$ and the first HCG black level sample $RST1_{HCG}$, which results in $RST1_{HCG}$+$RST2_{HCG}$ being latched into the pre-latch stage 538.

At time T8, the first feedback latch enable signal LAT_FB_EN_H 556H is pulsed again, which causes the $RST1_{HCG}$+$RST2_{HCG}$ value that is latched in the pre-latch stage 538 to be latched into the first conversion gain (e.g., HCG) feedback latch 532H-n of the feedback latch stage 532.

Next, the HCG PDAF sample event $SIG_{HCG}^{L}$ occurs and the Gray code signals Q_GC<12:0> 522 count as the ramp signal 514 ramps down until CMPOUT 550 (not shown) stops the Gray code signals Q_GC<12:0> 522 from counting and causes the front end latch stage 526 to latch the HCG PDAF sample value $SIG_{HCG}^{L}$ as represented in Gray code signal Q_GC<12:0> 522.

At time T9, it is noted that the adder operation signal FA_OP 560 transitions to a low value of "0" and that the bit shift signal BIT_SHFT 563 transitions to a high value of "1." Accordingly, the first multiplexer stage MUX1 534A is configured to select the second outputs "Qb" of the feedback latch stage 532 in response to the adder operation signal FA_OP 560, which results in a subtraction operation by the adder stage 536 as discussed above. In addition, the third multiplexer stage MUX3 534C is configured to perform a bit shift operation, which will result in a fractional output, or a divide-by-2 output of the value latched in the feedback stage 532 as discussed above.

At time T10, the signal latch enable signal LAT_SIG_EN 554 and pre-latch enable signal LAT_PRE_EN 562 are pulsed, which causes the GC to binary stage 530 to convert the Gray code Q_GC<12:0> 522 representation of the HCG PDAF sample $SIG_{HCG}^{L}$ latched in signal latch stage 528 to binary, which is coupled to be received at the first input "A" of the adder stage 536. At the same time, the $RST1_{HCG}$+$RST2_{HCG}$ value previously latched in the first conversion gain (e.g., HCG) feedback latch 532H-n of the feedback latch stage 532 (at time T8) is converted into a negative number (e.g., 2's complement) in response to the adder operation signal FA_OP 560 being a low value of "0" and is also divided by 2 in response to the bit shift signal BIT_SHFT 563 being a high value of "1" at this time. As such, $-(RST1_{HCG}+RST2_{HCG})/2$ is received at the second input "B" of the adder stage 536. As can be appreciated, $(RST1_{HCG}+RST2_{HCG})/2$ is the average value of $RST1_{HCG}$ and $RST2_{HCG}$. As such, the adder stage 536 is configured to determine the sum of the HCG PDAF signal $SIG_{HCG}^{L}$ and $-(RST1_{HCG}+RST2_{HCG})/2$, which results in a normalized (e.g., CMS) HCG PDAF signal of $SIG_{HCG}^{L}-(RST1_{HCG}+RST2_{HCG})/2$ being latched into the pre-latch stage 538.

Next, the adder operation signal FA_OP 560 transitions back to a high value of "1" and that the bit shift signal BIT_SHFT 563 transitions back to a low value of "0." At time T11, the second data latch signal LAT_DAT_EN_L 564L is pulsed, which results in the normalized (e.g., CMS) HCG PDAF signal of $SIG_{HCG}^{L}-(RST1_{HCG}+RST2_{HCG})/2$ being latched into the second data latch 540L-n of the data latch stage 540. As will be discussed, the normalized HCG PDAF signal of $SIG_{HCG}^{L}-(RST1_{HCG}+RST2_{HCG})/2$ is now available to be read out from the output of ALU 518 through second transmission gate 542L-n at this time. As will be discussed below, in one example, it is appreciated that the readout from the second data latch 540L-n of the data latch stage 540 is time-interleaved and may therefore be used to read out the normalized HCG PDAF signal of $SIG_{HCG}^{L}-(RST1_{HCG}+RST2_{HCG})/2$ as well as the normalized LCG image signal at a later time.

Next, the first HCG signal level sample event $SIG_{HCG}^{L+R}$ occurs and the Gray code signals Q_GC<12:0> 522 count as the ramp signal 514 ramps down until CMPOUT 550 (not shown) stops the Gray code signals Q_GC<12:0> 522 from counting and causes the front end latch stage 526 to latch the first HCG signal level sample value $SIG_{HCG}^{L+R}$ as represented in Gray code signal Q_GC<12:0> 522.

At time T12, it is noted that the adder operation signal FA_OP 560 again transitions to a low value of "0." Accordingly, the first multiplexer stage MUX1 534A is configured to select the second outputs "Qb" of the feedback latch stage 532 in response to the adder operation signal FA_OP 560, which results in a subtraction operation by the adder stage 536 as discussed above.

At time T13, the signal latch enable signal LAT_SIG_EN 554 and pre-latch enable signal LAT_PRE_EN 562 are pulsed, which causes the GC to binary stage 530 to convert the Gray code Q_GC<12:0> 522 representation of the first HCG image sample $SIG_{HCG}^{L+R}$ latched in signal latch stage 528 to binary, which is coupled to be received at the first input "A" of the adder stage 536. At the same time, the $RST1_{HCG}$+$RST2_{HCG}$ value previously latched in the first conversion gain (e.g., HCG) feedback latch 532H-n of the feedback latch stage 532 (at time T8) is converted into a negative number (e.g., 2's complement) in response to the adder operation signal FA_OP 560 being a low value of "0." It is noted that the $RST1_{HCG}+RST2_{HCG}$ value is not divided by 2 as the bit shift signal BIT_SHFT 563 is set to a low value of "0" at this time. As such, $-(RST1_{HCG}+RST2_{HCG})$ is received at the second input "B" of the adder stage 536. As such, the adder stage 536 is configured to determine the sum of the first HCG image sample $SIG1_{HCG}^{L+R}$ and $-(RST1_{HCG}+RST2_{HCG})$, which results in $SIG_{HCG}^{L+R}-(RST1_{HCG}+RST2_{HCG})$ being latched into the pre-latch stage 538.

Next, the adder operation signal FA_OP 560 transitions back to a high value of "1." At time T14, the first feedback latch enable signal LAT_FB_EN_H 556H is pulsed, which causes the $SIG1_{HCG}^{L+R}-(RST1_{HCG}+RST2_{HCG})$ value that is latched in the pre-latch stage 538 to be latched into the first conversion gain (e.g., HCG) feedback latch 532H-n of the feedback latch stage 532.

Next, the second HCG signal level sample event $SIG2_{HCG}^{L+R}$ occurs and the Gray code signals Q_GC<12:0> 522 count as the ramp signal 514 ramps down until CMPOUT 550 (not shown) stops the Gray code signals Q_GC<12:0> 522 from counting and causes the front end latch stage 526 to latch the second HCG signal level sample value $SIG2_{HCG}^{L+R}$ as represented in Gray code signal Q_GC<12:0> 522.

At time T15, the signal latch enable signal LAT_SIG_EN 554 and pre-latch enable signal LAT_PRE_EN 562 are pulsed, which causes the GC to binary stage 530 to convert the Gray code Q_GC<12:0> 522 representation of the second HCG image sample $SIG2_{HCG}^{L+R}$ latched in signal latch stage 528 to binary, which is coupled to be received at the first input "A" of the adder stage 536. At the same time, the $SIG1_{HCG}^{L+R}-(RST1_{HCG}+RST2_{HCG})$ value previously latched in the first conversion gain (e.g., HCG) feedback latch 532H-n of the feedback latch stage 532 (at time T14) is received at the second input "B" of the adder stage 536. As such, the adder stage 536 is configured to determine the sum of the second HCG image sample $SIG2_{HCG}^{L+R}$ and $SIG1_{HCG}^{L+R}-(RST1_{HCG}+RST2_{HCG})$, which results in the normalized HCG image signal $(SIG1_{HCG}^{L+R}+SIG2_{HCG}^{L+R})-(RST1_{HCG}+RST2_{HCG})$ being latched into the pre-latch stage 538.

At time T16, the first data latch signal LAT_DAT_EN_H 564L is pulsed, which results in the normalized (e.g., CMS) HCG image signal of $(SIG1_{HCG}^{L+R}+SIG2_{HCG}^{L+R})-(RST1_{HCG}+RST2_{HCG})$ being latched into the first data latch 540H-n of the data latch stage 540. As will be discussed, the normalized HCG image signal of $(SIG1_{HCG}^{L+R}+SIG2_{HCG}^{L+R})-(RST1_{HCG}+RST2_{HCG})$ is now available to be read out from the output of ALU 518 through first transmission gate 542H-n at this time.

Next, at time T17, the select conversion gain signal SEL_CG 561 transitions back to a low value of "0," which causes the second multiplexer stage MUX2 534B to select the second multiplexer 534AL-n, which is coupled to the outputs of the second conversion gain (e.g., LCG) feedback latch 532L-n of the feedback latch stage 532.

Next, the LCG signal level sample event $SIG_{LCG}^{L+R}$ occurs and the Gray code signals Q_GC<12:0> 522 count as the ramp signal 514 ramps down until CMPOUT 550 (not shown) stops the Gray code signals Q_GC<12:0> 522 from counting and causes the front end latch stage 526 to latch the LCG signal level sample value $SIG_{LCG}^{L+R}$ as represented in Gray code signal Q_GC<12:0> 522.

At time T18, it is noted that the adder operation signal FA_OP 560 again transitions to a low value of "0." Accordingly, the first multiplexer stage MUX1 534A is configured to select the second outputs "Qb" of the feedback latch stage 532 in response to the adder operation signal FA_OP 560, which results in a subtraction operation by the adder stage 536 as discussed above.

At time T19, the signal latch enable signal LAT_SIG_EN 554 and pre-latch enable signal LAT_PRE_EN 562 are pulsed, which causes the GC to binary stage 530 to convert the Gray code Q_GC<12:0> 522 representation of the LCG image sample $SIG_{LCG}^{L+R}$ latched in signal latch stage 528 to binary, which is coupled to be received at the first input "A" of the adder stage 536. At the same time, the LCG black level sample event $RST_{LCG}$ previously latched in the second conversion gain (e.g., LCG) feedback latch 532L-n of the feedback latch stage 532 (at time T3) is converted into a negative number (e.g., 2's complement) in response to the adder operation signal FA_OP 560 being a low value of "0." It is noted that the $RST_{LCG}$ value is not divided by 2 as the bit shift signal BIT_SHFT 563 is set to a low value of "0" at this time. As such, $-RST_{LCG}$ is received at the second input "B" of the adder stage 536. As such, the adder stage 536 is configured to determine the sum of the LCG image sample $SIG_{LCG}^{L+R}$ and $-RST_{LCG}$, which results in the normalized LCG image signal $SIG_{LCG}^{L+R}-RST_{LCG}$ being latched into the pre-latch stage 538.

Next, the adder operation signal FA_OP 560 transitions back to a high value of "1." At time T20, the second data latch signal LAT_DAT_EN_L 564L is pulsed, which results in the normalized (e.g., CDS) LCG image signal of $SIG_{LCG}^{L+R}-RST_{LCG}$ being latched into the second data latch 540L-n of the data latch stage 540. The normalized LCG image signal of $SIG_{LCG}^{L+R}-RST_{LCG}$ is now available to be read out from the output of ALU 518 through second transmission gate 542L-n at this time. As mentioned previously, in one example, it is appreciated that the readout from the second data latch 540L-n of the data latch stage 540 is time-interleaved and may therefore be used to read out the normalized HCG PDAF signal of $SIG_{HCG}^{L}-(RST1_{HCG}+RST2_{HCG})/2$ as well as the normalized LCG image signal $SIG_{LCG}^{L+R}-RST_{LCG}$.

FIG. 5C illustrates an example of the timing and signal flow during a readout of the normalized LCG image signal, the normalized HCG image signal, and the normalized HCG PDAF signal, which are generated as described above in FIG. 5B from ALU 518 as described above in FIG. 5A. Accordingly, similarly named and numbered elements described above are coupled and function similarly below.

As described above in FIG. 5B, FIG. 5C illustrates the same ramp signal 514, which includes one LCG black level sample event $RST_{LCG}$, two HCG black level sample events $RST_{HCG}$, which may also be referred to as $RST1_{HCG}$ and $RST2_{HCG}$, one HCG PDAF sample event $SIG_{HCG}^{L}$, two HCG image signal sample events $SIG_{HCG}^{L+R}$, which may also be referred to as $SIG1_{HCG}^{L+R}$ and $SIG2_{HCG}^{L+R}$, and then one LCG image signal sample events $SIG_{LCG}^{L+R}$. The example depicted in FIG. 5C also illustrates the same Gray code signals Q_GC<12:0> 522, second data latch enable signal LAT_DAT_EN_L 564L, and first data latch enable signal LAT_DAT_EN_H 564H. The example depicted in FIG. 5C further illustrates an LCG latch data read signal LCG_LAT_DAT_READ 565L, and an HCG latch data read signal HCG_LAT_DAT_READ 565H.

As mentioned, the second data latch enable signal LAT_DAT_EN_L 564L and first data latch enable signal LAT_DAT_EN_H 564H depicted in FIG. 5C are the same as depicted in FIG. 5B. Accordingly, FIG. 5C shows that at time T11, the second data latch enable signal LAT_

DAT_EN_L 564L is pulsed at which time the normalized (e.g., CMS) HCG PDAF signal of $SIG_{HCG}^L-(RST1_{HCG}+RST2_{HCG})/2$ is latched into the second data latch 540L-n of the data latch stage 540 as described in FIG. 5B. As such, the LCG latch data read signal LCG_LAT_DAT_READ 565L shows in FIG. 5C a first readout period R1(N) during which the normalized HCG PDAF signal $SIG_{HCG}^L-(RST1_{HCG}+RST2_{HCG})/2$ is available to be read out from the second data latch 540L-n of the data latch stage 540 for row N.

Similarly, FIG. 5C shows that at time T16, the first data latch enable signal LAT_DAT_EN_H 564H is pulsed at which time the normalized (e.g., CMS) HCG image signal of $(SIG_{HCG}^{L+R}+SIG2_{HCG}^{L+R})-(RST1_{HCG}+RST2_{HCG})$ is latched into the first data latch 540H-n of the data latch stage 540 as described in FIG. 5B. As such, the HCG latch data read signal HCG_LAT_DAT_READ 565H shows a second readout period R2(N) during which the normalized HCG image signal $(SIG1_{HCG}^{L+R}+SIG2_{HCG}^{L+R})-(RST1_{HCG}+RST2_{HCG})$ is available to be read out from the first data latch 540H-n of the data latch stage 540 for row N as shown in FIG. 5C. It is noted that the second readout period R2(N) continues past the right side of FIG. 5C. However, it is also noted that on that left side of FIG. 5C, the latter portion of the second readout period R2(N−1) from the previous row N−1 is still visible.

FIG. 5C shows that at time T20, the second data latch enable signal LAT_DAT_EN_L 564L is pulsed at which time the normalized (e.g., CDS) LCG image signal of $SIG_{LCG}^{L+R}-RST_{LCG}$ is latched into the second data latch 540L-n of the data latch stage 540 as described in FIG. 5B. Therefore, it is appreciated that after time T20, the normalized LCG image signal of $SIG_{LCG}^{L+R}-RST_{LCG}$ is available to be read out from the second data latch 540L-n of the data latch stage 540. In one example, after the second readout period R2(N) for row N is completed, the LCG latch data read signal LCG_LAT_DAT_READ 565L may be activated to enable a third readout period R3(N) during which time the normalized LCG image signal $SIG_{LCG}^{L+R}-RST_{LCG}$ from the second data latch 540L-n of the data latch stage 540 for row N may be read out. Although not visible in FIG. 5C for row N, FIG. 5C illustrates that the third readout period R3(N−1) for the previous row N−1 occurs in LCG_LAT_DAT_READ 565L after the completion of the second readout period R2(N−1) in HCG_LAT_DAT_READ 565G for the previous row N−1. As shown in FIG. 5C, the third readout period R3(N−1) for the previous row N−1 is completed before time T11, at which time the normalized HCG PDAF signal of $SIG_{HCG}^L-(RST1_{HCG}+RST2_{HCG})/2$ is latched into the second data latch 540L-n of the data latch stage 540 for the next row N.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An arithmetic logic unit (ALU), comprising:
   a front end latch stage coupled to a Gray code (GC) generator to latch GC outputs of the GC generator in response to a comparator output;
   a signal latch stage coupled to latch outputs of the front end latch stage in response to a signal latch enable signal;
   a GC to binary stage coupled to generate a binary representation of the GC outputs latched in the signal latch stage;
   an adder stage including first inputs and second inputs, wherein the first inputs of the adder stage are coupled to receive outputs of the GC to binary stage, wherein outputs of the adder stage are generated in response to the first inputs and the second inputs of the adder stage;
   a pre-latch stage coupled to latch outputs of the adder stage in response to a pre-latch enable signal; and
   a feedback latch stage coupled to latch outputs of the pre-latch stage, wherein the second inputs of the adder stage are coupled to receive outputs of the feedback latch stage, wherein the feedback latch stage comprises:
      first conversion gain feedback latches configured to latch outputs of the pre-latch stage having a first conversion gain in response to a first feedback latch enable signal; and
      second conversion gain feedback latches configured to latch outputs of the pre-latch stage having a second conversion gain in response to a second feedback latch enable signal.

2. The ALU of claim 1, wherein outputs of each of the first conversion gain feedback latches and each of the second conversion gain feedback latches include first outputs and second outputs, wherein the first outputs of the first conversion gain feedback latches and the first outputs of the second conversion gain feedback latches are the latched outputs of the pre-latch stage, wherein the second outputs of the first conversion gain feedback latches and the second outputs of the second conversion gain feedback latches are inverted latched outputs of the pre-latch stage, wherein the ALU further comprises:
   a first multiplexer stage coupled to the first outputs and the second outputs of the first conversion gain feedback latches and the first outputs and the second outputs of the second conversion gain feedback latches, wherein the first multiplexer stage is configured to output either the first outputs or the second outputs of each of the first conversion gain feedback latches and each of the second conversion gain feedback latches in response to an adder operation signal.

3. The ALU of claim 2, further comprising a second multiplexer stage coupled to outputs of the first multiplexer stage, wherein the second multiplexer stage is configured to output either the first outputs or the second outputs of each of the first conversion gain feedback latches or the first outputs or the second outputs of each of the second conversion gain feedback latches in response to a select conversion gain signal.

4. The ALU of claim 3, further comprising a third multiplexer stage coupled to outputs of the second multiplexer stage, wherein the third multiplexer stage is configured to output either an output from a same bit of the second multiplexer stage or an output from a higher bit of the second multiplexer stage in response to a bit shift signal, wherein a most significant bit (MSB) of the third multiplexer stage is configured to output either the output from the same bit of the second multiplexer stage or a high value in response to the bit shift signal, wherein outputs of the third multiplexer stage are the outputs of the feedback latch stage coupled to the second inputs of the adder stage.

5. The ALU of claim 4, wherein a least significant bit (LSB) of the adder stage is coupled to receive a low value at a carry-in input when the first multiplexer stage is configured to couple the first outputs of each of the first conversion gain feedback latches and the first outputs of each of the second conversion gain feedback latches to the second inputs of the adder stage,
wherein the LSB of the adder stage is further coupled to receive a high value at the carry-in input when the first multiplexer stage is configured to couple the second outputs of each of the first conversion gain feedback latches and the second outputs of each of the second conversion gain feedback latches to the second inputs of the adder stage.

6. The ALU of claim 5, wherein the adder stage is configured to add a feedback value latched in the feedback latch stage and the binary representation of the GC outputs latched in the signal latch stage when the first multiplexer stage is configured to couple the first outputs of the feedback latch stage to the second inputs of the adder stage.

7. The ALU of claim 5, wherein the adder stage is configured to add a two's complement representation of a feedback value latched in the feedback latch stage and the binary representation of the GC outputs latched in the signal latch stage when the first multiplexer stage is configured to couple the second outputs of the feedback latch stage to the second inputs of the adder stage.

8. The ALU of claim 1, further comprising a data latch stage coupled to latch outputs of the pre-latch stage, wherein the data latch stage comprises:
first conversion gain data latches configured to latch outputs of the pre-latch stage having a first conversion gain in response to a first data latch enable signal; and
second conversion gain data latches configured to latch outputs of the pre-latch stage having a second conversion gain in response to a second data latch enable signal.

9. The ALU of claim 1, wherein the ALU is one of a plurality of ALUs coupled to a pixel array of an imaging system, wherein the plurality of ALUs are configured to determine a difference between a first value responsive to an accumulated sum of one or more signal level samples and a second value responsive to an accumulated sum of one or more black level samples from each of a plurality of pixel circuits of the pixel array.

10. The ALU of claim 9, wherein the second value is responsive to a fraction of the accumulated sum of the one or more black level samples from each of the plurality of pixel circuits of the pixel array.

11. The ALU of claim 1, wherein the GC outputs of the GC generator include N bits, wherein the GC to binary stage includes N exclusive-OR (XOR) gates,
wherein first inputs of the N XOR gates are coupled to receive respective bits of the GC outputs of the GC generator,
wherein second inputs of N-1 XOR gates corresponding to least N-1 significant bits of the GC outputs of the GC generator are coupled to receive respective outputs of nearest neighboring XOR gates corresponding to a higher bit value,
wherein a second input of an Nth XOR gate corresponding to a most significant bit (MSB) of the GC outputs of the GC generator is coupled to receive a low value.

12. The ALU of claim 1, further comprising a pulse generator coupled to generate a front end latch enable signal in response to the comparator output, wherein the front end latch stage is coupled to latch the GC outputs of the GC generator in response to the front end latch enable signal.

13. The ALU of claim 12, further comprising a bypass switch coupled between an input of the pulse generator and an output of the pulse generator, wherein the front end latch enable signal is substantially equal to the comparator output when the bypass switch is closed, wherein the front end latch enable signal is substantially equal to an output of the pulse generator when the bypass switch is opened.

14. The ALU of claim 1, wherein the feedback latch stage is configured to be reset in response to a feedback latch reset signal.

15. An imaging system, comprising:
a pixel array including a plurality of pixel circuits arranged into rows and columns, wherein each one of the plurality of pixel circuits is coupled to generate an analog image data signal in response to incident light;
control circuitry coupled to the pixel array to control operation of the pixel array; and
a readout circuit coupled to the pixel array through a plurality of column bit lines, wherein the readout circuit comprises:
a plurality of comparators, wherein each one of the plurality of comparators is coupled to receive a ramp signal, wherein each one of the plurality of comparators is further coupled to a respective one of a plurality of column bit lines to receive a respective analog image data signal, wherein each one of the plurality of comparators is coupled to generate a respective comparator output in response to a comparison of the respective analog image data signal and the ramp signal;
a Gray code (GC) generator coupled to generate GC outputs; and
a plurality of arithmetic logic units (ALUs), wherein each one of the plurality of ALUs is coupled to receive the GC outputs, wherein each one of the plurality of ALUs is further coupled to a respective one of the plurality of comparators to receive the respective comparator output, wherein each one of the plurality of ALUs comprises:
a front end latch stage coupled to the GC generator to latch the GC outputs of the GC generator in response to the respective comparator output;
a signal latch stage coupled to latch outputs of the front end latch stage in response to a signal latch enable signal;
a GC to binary stage coupled to generate a binary representation of the GC outputs latched in the signal latch stage;
an adder stage including first inputs and second inputs, wherein the first inputs of the adder stage are coupled to receive outputs of the GC to binary stage, wherein outputs of the adder stage are generated in response to the first inputs and the second inputs of the adder stage;
a pre-latch stage coupled to latch outputs of the adder stage in response to a pre-latch enable signal; and
a feedback latch stage coupled to latch outputs of the pre-latch stage, wherein the second inputs of the adder stage are coupled to receive outputs of the feedback latch stage, wherein the feedback latch stage comprises:

first conversion gain feedback latches configured to latch outputs of the pre-latch stage having a first conversion gain in response to a first feedback latch enable signal; and
second conversion gain feedback latches configured to latch outputs of the pre-latch stage having a second conversion gain in response to a second feedback latch enable signal.

16. The imaging system of claim 15, further comprising function logic coupled to the readout circuit to store the image data read out from the pixel array.

17. The imaging system of claim 15, wherein outputs of each of the first conversion gain feedback latches and each of the second conversion gain feedback latches include first outputs and second outputs, wherein the first outputs of the first conversion gain feedback latches and the first outputs of the second conversion gain feedback latches are the latched outputs of the pre-latch stage, wherein the second outputs of the first conversion gain feedback latches and the second outputs of the second conversion gain feedback latches are inverted latched outputs of the pre-latch stage, wherein each one of the plurality of ALUs comprises:
a first multiplexer stage coupled to the first outputs and the second outputs of the first conversion gain feedback latches and the first outputs and the second outputs of the second conversion gain feedback latches, wherein the first multiplexer stage is configured to output either the first outputs or the second outputs of each of the first conversion gain feedback latches and each of the second conversion gain feedback latches in response to an adder operation signal.

18. The imaging system of claim 17, wherein each one of the plurality of ALUs further comprises a second multiplexer stage coupled to outputs of the first multiplexer stage, wherein the second multiplexer stage is configured to output either the first outputs or the second outputs of each of the first conversion gain feedback latches or the first outputs or the second outputs of each of the second conversion gain feedback latches in response to a select conversion gain signal.

19. The imaging system of claim 18, wherein each one of the plurality of ALUs further comprises a third multiplexer stage coupled to outputs of the second multiplexer stage, wherein the third multiplexer stage is configured to output either an output from a same bit of the second multiplexer stage or an output from a higher bit of the second multiplexer stage in response to a bit shift signal, wherein a most significant bit (MSB) of the third multiplexer stage is configured to output either the output from the same bit of the second multiplexer stage or a high value in response to the bit shift signal, wherein outputs of the third multiplexer stage are the outputs of the feedback latch stage coupled to the second inputs of the adder stage.

20. The imaging system of claim 19, wherein a least significant bit (LSB) of the adder stage is coupled to receive a low value at a carry-in input when the first multiplexer stage is configured to couple the first outputs of each of the first conversion gain feedback latches and the first outputs of each of the second conversion gain feedback latches to the second inputs of the adder stage,
wherein the LSB of the adder stage is further coupled to receive a high value at the carry-in input when the first multiplexer stage is configured to couple the second outputs of each of the first conversion gain feedback latches and the second outputs of each of the second conversion gain feedback latches to the second inputs of the adder stage.

21. The imaging system of claim 20, wherein the adder stage is configured to add a feedback value latched in the feedback latch stage and the binary representation of the GC outputs latched in the signal latch stage when the first multiplexer stage is configured to couple the first outputs of the feedback latch stage to the second inputs of the adder stage.

22. The imaging system of claim 20, wherein the adder stage is configured to add a two's complement representation of a feedback value latched in the feedback latch stage and the binary representation of the GC outputs latched in the signal latch stage when the first multiplexer stage is configured to couple the second outputs of the feedback latch stage to the second inputs of the adder stage.

23. The imaging system of claim 15, wherein each one of the plurality of ALUs further comprises a data latch stage coupled to latch outputs of the pre-latch stage, wherein the data latch stage comprises:
first conversion gain data latches configured to latch outputs of the pre-latch stage having a first conversion gain in response to a first data latch enable signal; and
second conversion gain data latches configured to latch outputs of the pre-latch stage having a second conversion gain in response to a second data latch enable signal.

24. The imaging system of claim 15, wherein the plurality of ALUs are configured to determine a difference between a first value responsive to an accumulated sum of one or more signal level samples and a second value responsive to an accumulated sum of one or more black level samples from each of the plurality of pixel circuits of the pixel array.

25. The imaging system of claim 24, wherein the second value is responsive to a fraction of the accumulated sum of the one or more black level samples from each of the plurality of pixel circuits of the pixel array.

26. The imaging system of claim 15, wherein the GC outputs of the GC generator include N bits, wherein the GC to binary stage includes N exclusive-OR (XOR) gates,
wherein first inputs of the N XOR gates are coupled to receive respective bits of the GC outputs of the GC generator,
wherein second inputs of N-1 XOR gates corresponding to least N-1 significant bits of the GC outputs of the GC generator are coupled to receive respective outputs of nearest neighboring XOR gates corresponding to a higher bit value,
wherein a second input of an Nth XOR gate corresponding to a most significant bit (MSB) of the GC outputs of the GC generator is coupled to receive a low value.

27. The imaging system of claim 15, wherein each one of the plurality of ALUs further comprises a pulse generator coupled to generate a front end latch enable signal in response to the respective comparator output, wherein the front end latch stage is coupled to latch the GC outputs of the GC generator in response to the front end latch enable signal.

28. The imaging system of claim 27, wherein each one of the plurality of ALUs further comprises a bypass switch coupled between an input of the pulse generator and an output of the pulse generator, wherein the front end latch enable signal is substantially equal to the respective comparator output when the bypass switch is closed, wherein the front end latch enable signal is substantially equal to an output of the pulse generator when the bypass switch is opened.

29. The imaging system of claim 15, wherein the feedback latch stage is configured to be reset in response to a feedback latch reset signal.

\* \* \* \* \*